United States Patent
Hayakawa et al.

(10) Patent No.: US 11,472,956 B2
(45) Date of Patent: Oct. 18, 2022

(54) RESIN COMPOSITION FOR FORMING PHASE-SEPARATED STRUCTURE, METHOD FOR PRODUCING STRUCTURE INCLUDING PHASE-SEPARATED STRUCTURE, AND BLOCK COPOLYMER

(71) Applicants: TOKYO OHKA KOGYO CO., LTD., Kawasaki (JP); TOKYO INSTITUTE OF TECHNOLOGY, Tokyo (JP)

(72) Inventors: Teruaki Hayakawa, Tokyo (JP); Lei Dong, Tokyo (JP); Takahiro Dazai, Kawasaki (JP); Ken Miyagi, Kawasaki (JP); Takayoshi Mori, Kawasaki (JP); Daisuke Kawana, Kawasaki (JP)

(73) Assignees: TOKYO OHKA KOGYO CO., LTD., Kawasaki (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 17/305,618

(22) Filed: Jul. 12, 2021

(65) Prior Publication Data

US 2022/0017741 A1  Jan. 20, 2022

(30) Foreign Application Priority Data

Jul. 20, 2020  (JP) ............... JP2020-124078

(51) Int. Cl.
| | | |
|---|---|---|
| *C08F 212/08* | (2006.01) | |
| *C08L 53/00* | (2006.01) | |
| *C08F 220/14* | (2006.01) | |
| *B05D 3/02* | (2006.01) | |
| *B05D 7/24* | (2006.01) | |
| *B05D 5/00* | (2006.01) | |
| *C08F 220/38* | (2006.01) | |

(52) U.S. Cl.
CPC .............. *C08L 53/005* (2013.01); *B05D 3/02* (2013.01); *B05D 5/00* (2013.01); *B05D 7/24* (2013.01); *C08F 212/08* (2013.01); *C08F 220/14* (2013.01); *C08F 220/382* (2020.02)

(58) Field of Classification Search
CPC .... C08F 212/08; C08F 220/38; C08F 220/14; C08F 297/026
See application file for complete search history.

(56) References Cited

U.S. PATENT DOCUMENTS 4,107,235 A * 8/1978 DeWitt, III ............ C08J 7/0427
525/212

FOREIGN PATENT DOCUMENTS

JP  2008-036491 A  2/2008

OTHER PUBLICATIONS

William Hinsberg et al., Self-Assembling Materials for Lithographic Patterning:Overview, Status and Moving Forward, Proceedings of SPIE, vol. 7637, 76370G-1 to , 76370G-10, 2010.
Yasunari Yoshimura et al., Chemically tailored high-x block copolymers for perpendicular lamellae via thermal annealing, Soft Matter, 2019, 15, 3497-3506.

* cited by examiner

*Primary Examiner* — Robert C Boyle
(74) *Attorney, Agent, or Firm* — Knobbe, Martens, Olson & Bear LLP

(57) ABSTRACT

A resin composition for forming a phase-separated structure containing a block copolymer having a first block and a second block, in which the first block is formed of a constituent unit represented by Formula (b1), the second block is formed of a constituent unit represented by Formula (b2m) and a random copolymer having a constituent unit represented by Formula (b2g), and a ratio of a volume of the first block is 20% to 80% by volume. In the formulas, $R^1$ is a hydrogen atom or an alkyl group, $R^{b1}$ is a hydrogen atom or a methyl group, $R^2$ is an alkyl group which may have a silicon atom, a fluorine atom, a carboxy group, an amino group, a hydroxy group, or a phosphoric acid group, $R^3$ is a linear or branched alkylene group having 1 to 10 carbon atoms, which may have a hydroxy group, and $R^{b2}$ is a hydrogen atom, an alkyl group having 1 to 5 carbon atoms, or a halogenated alkyl group having 1 to 5 carbon atoms

5 Claims, 1 Drawing Sheet

RESIN COMPOSITION FOR FORMING PHASE-SEPARATED STRUCTURE, METHOD FOR PRODUCING STRUCTURE INCLUDING PHASE-SEPARATED STRUCTURE, AND BLOCK COPOLYMER

BACKGROUND OF THE INVENTION

Field of the Invention

The present invention relates to a resin composition for forming a phase-separated structure, a method for producing a structure including a phase-separated structure, and a block copolymer.

Priority is claimed on Japanese Patent Application No. 2020-124078, filed Jul. 20, 2020, the content of which is incorporated herein by reference.

Description of Related Art

In recent years, following further miniaturization of a large-scale integrated circuit (LSI), a technique for processing finer structures has been demanded.

For such a demand, a technique has been developed for forming finer patterns by utilizing a phase-separated structure formed by the self-organization of the block copolymers in which incompatible blocks are bonded to each other (see, for example, Japanese Unexamined Patent Application, Publication No. 2008-36491).

In order to utilize the phase-separated structure of the block copolymer, it is essential to form self-organized nanostructures, which are formed by microphase separation, only in a specific region and arrange the nanostructures in the desired direction. In order to realize such position control and orientation control, processes such as graphoepitaxy for controlling the phase separation pattern by the guide patterns and chemical epitaxy for controlling the phase separation pattern by the difference in the chemical state of the substrate have been proposed (See, for example, Proceedings of SPIE, Vol. 7637, No. 76370G-1, 2010).

The block copolymer forms a structure having a regular periodic structure by the phase separation.

The "period of a structure" means the period of the phase structure observed when the structure of a phase-separated structure is formed and refers to the sum of the lengths of the phases each of which is incompatible. In a case where the phase-separated structure forms a cylinder structure perpendicular to the substrate surface, the period (L0) of the structure is a distance (pitch) between centers of two adjacent cylinder structures.

It is known that the period (L0) of the structure is determined by inherent polymerization properties such as the degree of polymerization N and interaction parameter $\chi$ of Flory-Huggins. That is, the larger the product "$\chi \times N$" of $\chi$ and N, the greater the mutual repulsion between the different blocks in the block copolymer becomes. Therefore, in a case of the relationship of $\chi \times N > 10.5$ (hereinafter, referred to as "strong separation limit"), the repulsion between the different kinds of blocks in the block copolymer is large, and the tendency for phase separation to occur becomes strong. Accordingly, in the strong separation limit, the period of the structure is approximately $N^{2/3} \times \chi^{1/6}$, and satisfies the relationship of the following equation (1). That is, the period of the structure is proportional to the degree of polymerization N, which correlates with the molecular weight and the molecular weight ratio between the different blocks.

$$L0 \propto a \times N^{2/3} \times \chi^{1/6} \qquad (1)$$

[In equation (1), L0 represents a period of the structure. a is a parameter indicating the size of the monomer. N represents a degree of polymerization. $\chi$ is an interaction parameter, and the higher the value thereof, the higher the phase separation performance.]

Accordingly, the period (L0) of the structure can be controlled by adjusting the composition and the total molecular weight of the block copolymer.

It is known that the periodic structure which the block copolymer forms varies the form such as a cylinder (columnar phase), a lamella (plate phase), and a sphere (spherical phase) depending on a ratio of a volume of the polymer components, and the period depends on the molecular weight. Therefore, a method for increasing the molecular weight of the block copolymers can be considered in order to form the structure of a relatively large period (L0) by utilizing the phase-separated structure formed by the self-organization of the block copolymers.

It is also conceivable to use a method using a block copolymer having a larger interaction parameter (c) than that of a block copolymer having a block of styrene and a block of methyl methacrylate, which is a general-purpose block copolymer. For example, it is proposed in Yoshimura et al. Chemically tailored high-$\chi$ block copolymers for perpendicular lamellae via thermal annealing. Soft Matter, 2019, 15, 3497-3506 that a block copolymer contains a block of styrene and a block of 2-hydroxy-3-(2,2,2-trifluoroethylsulfanyl)propyl methacrylate.

SUMMARY OF THE INVENTION

In order to form a fine pattern by utilizing the phase-separated structure formed by the self-organization of the block copolymers, the phase-separated structure formed by the block copolymers preferably has vertical orientation. However, the block copolymers described in Yoshimura et al. Chemically tailored high-$\chi$ block copolymers for perpendicular lamellae via thermal annealing. Soft Matter, 2019, 15, 3497-3506 cannot form a phase-separated structure having vertical orientation.

In addition, in order to obtain a highly accurate structure, it is necessary to suppress the occurrence of defects (surface defects). The term "defects" refers to general abnormalities of a phase separation pattern, which are detected when observed from right above the phase separation pattern, using a scanning electron microscope or the like. Examples of these abnormalities include abnormalities caused by the deposition of foreign substances and deposits on a surface of the phase separation pattern, such as scum (resin composition residues) after the formation of the phase separation pattern, foam, and dust, abnormalities with regard to pattern shapes, such as bridges across different portions of the line pattern and the filling of holes in contact hole patterns, and color irregularities in the pattern. However, the block copolymers described in Yoshimura et al. Chemically tailored high-$\chi$ block copolymers for perpendicular lamellae via thermal annealing. Soft Matter, 2019, 15, 3497-3506 are difficult to reduce the occurrence of defects.

The present invention has been made in view of the above circumstances, and an object of the invention is to provide a resin composition for forming a phase-separated structure which can form a phase-separated structure with excellent vertical orientation and reduced occurrence of defects, a method for producing a structure including a phase-separated structure in which the resin composition for forming a phase-separated structure is used, and a block copolymer capable of being used in the production of the resin composition for forming a phase-separated structure.

That is, a first aspect of the present invention is a resin composition for forming a phase-separated structure containing a block copolymer having a first block and a second block, in which the first block includes a polymer having a repeating structure of a constituent unit represented by General Formula (b1), the second block includes a random copolymer having a structure in which a constituent unit represented by General Formula (b2m) and a constituent unit represented by General Formula (b2g) are arranged in a disorderly manner, and a ratio of a volume of the first block to a total volume of the first block and the second block is 20% to 80% by volume.

That is, a third aspect of the present invention is a block copolymer having a first block and a second block, in which the first block includes a polymer having a repeating structure of a constituent unit represented by General Formula (b1), the second block includes a random copolymer having a structure in which a constituent unit represented by General Formula (b2m) and a constituent unit represented by General Formula (b2g) are arranged in a disorderly manner, and a ratio of a volume of the first block to a total volume of the first block and the second block is 20% to 80% by volume.

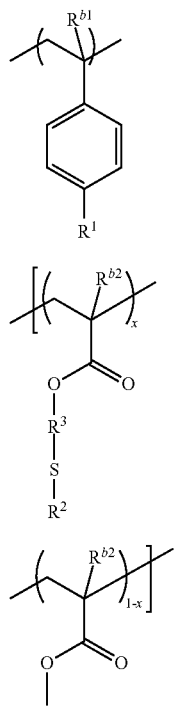

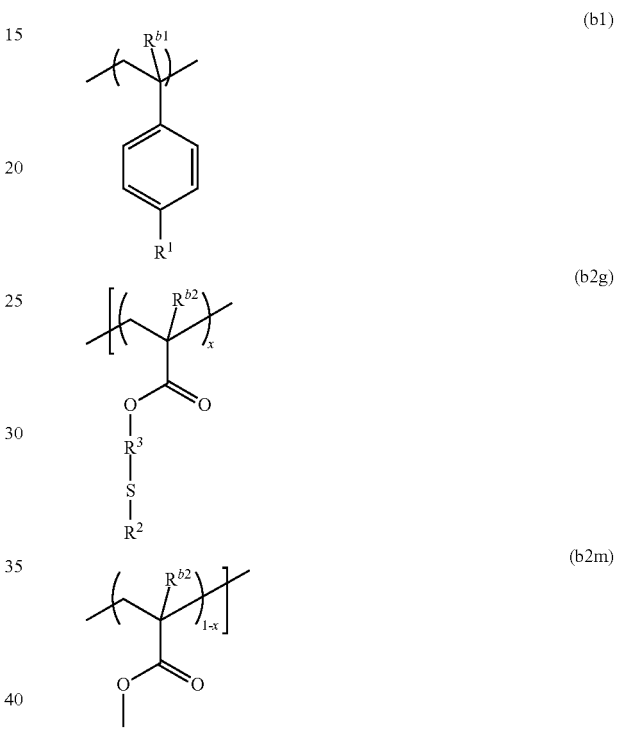

[In Formula (b1), $R^1$ is a hydrogen atom or an alkyl group. $R^{b1}$ is a hydrogen atom or a methyl group.

In Formula (b2g), $R^2$ is an alkyl group which may have a silicon atom, a fluorine atom, a carboxy group, an amino group, a hydroxy group, or a phosphoric acid group.

$R^3$ is a linear or branched alkylene group having 1 to 10 carbon atoms, which may have a hydroxy group.

In Formula (b2g) and Formula (b2m), $R^{b2}$ is a hydrogen atom, an alkyl group having 1 to 5 carbon atoms, or a halogenated alkyl group having 1 to 5 carbon atoms. A plurality of $R^{b2}$s may be the same or different from each other.

x and 1-x represent a molar ratio, and x is 0.1 or more and 0.9 or less.]

A second aspect of the present invention is a method for producing a structure including a phase-separated structure including a step of applying a resin composition for forming a phase-separated structure according to the first aspect on a support to form a layer including a block copolymer, and a step of phase-separating the layer including the block copolymer.

[In Formula (b1), $R^1$ is a hydrogen atom or an alkyl group. $R^{b1}$ is a hydrogen atom or a methyl group.

In Formula (b2g), $R^2$ is an alkyl group which may have a silicon atom, a fluorine atom, a carboxy group, an amino group, a hydroxy group, or a phosphoric acid group.

$R^3$ is a linear or branched alkylene group having 1 to 10 carbon atoms, which may have a hydroxy group.

In Formula (b2g) and Formula (b2m), $R^{b2}$ is a hydrogen atom, an alkyl group having 1 to 5 carbon atoms, or a halogenated alkyl group having 1 to 5 carbon atoms. A plurality of $R^{b2}$s may be the same or different from each other.

x and 1-x represent a molar ratio and x is 0.1 or more and 0.9 or less.]

According to the present invention, it is possible to provide a resin composition for forming a phase-separated structure which can form a phase-separated structure with excellent vertical orientation and reduced occurrence of defects, a method for producing a structure including a phase-separated structure in which the resin composition for forming a phase-separated structure is used, and a block copolymer capable of being used in the production of the resin composition for forming a phase-separated structure.

DETAILED DESCRIPTION OF THE INVENTION

Figure 1:
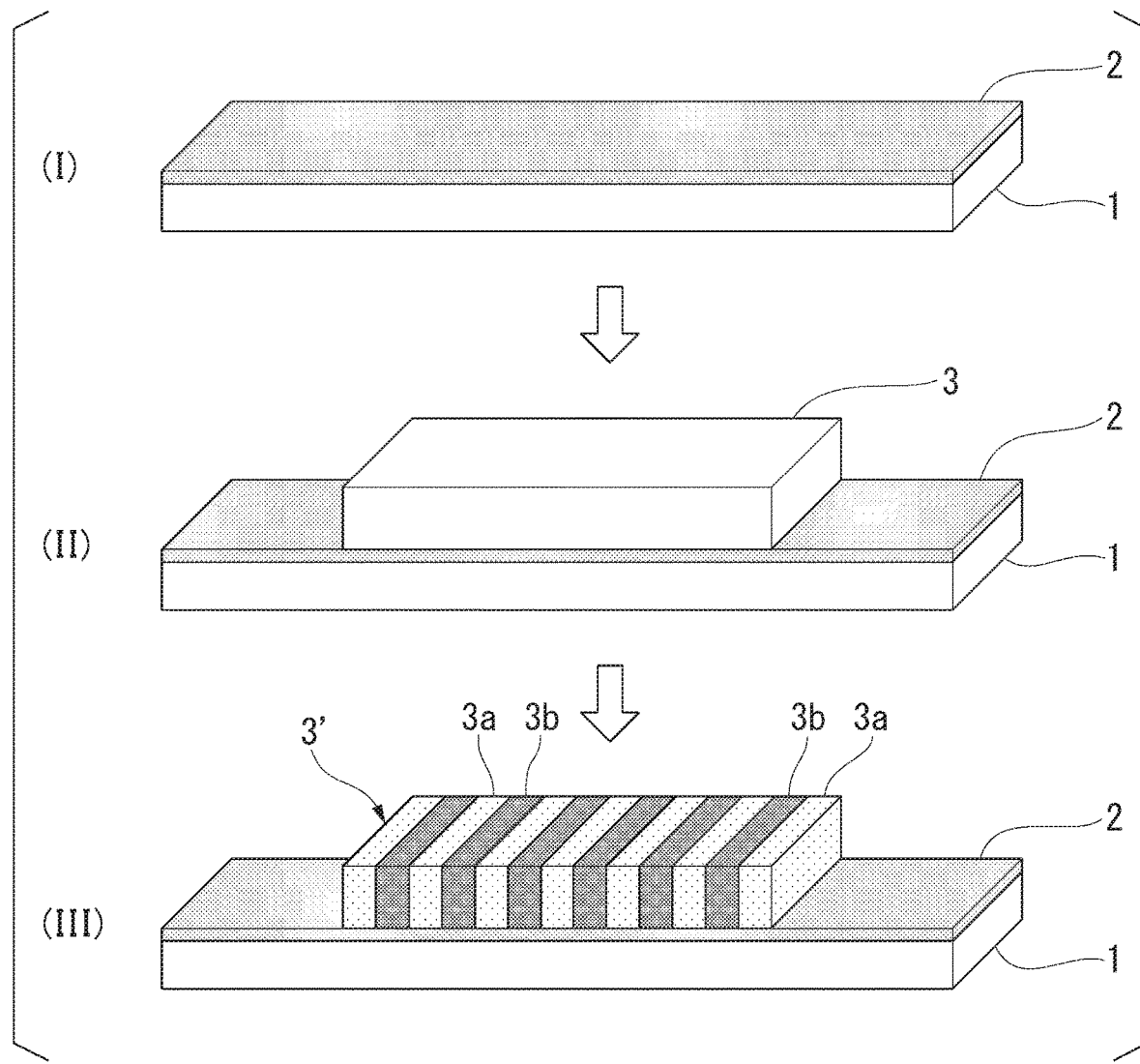
FIG. 1 is a schematic process diagram showing an example of an embodiment of a method for producing a structure including a phase-separated structure.

In this specification and claims, the term "aliphatic" is defined as a relative concept to aromatic, and means a group, a compound, and the like having no aromaticity.

Unless otherwise specified, the term "alkyl group" is intended to include linear, branched, and cyclic monovalent saturated hydrocarbon groups. The same applies to the alkyl group in the alkoxy group.

Unless otherwise specified, the term "alkylene group" is intended to include linear, branched, and cyclic divalent saturated hydrocarbon groups.

The term "halogenated alkyl group" is a group in which a part or all of the hydrogen atoms of an alkyl group are substituted with halogen atoms. Examples of the halogen atom include a fluorine atom, a chlorine atom, a bromine atom, and an iodine atom.

The term "fluorinated alkyl group" or "fluorinated alkylene group" is a group in which a part or all of the hydrogen atoms of an alkyl group or an alkylene group are substituted with fluorine atoms.

The term "constituent unit" means a monomer unit for constituting a polymer compound (resin, polymer, and copolymer).

The term "may have a substituent" includes both a case where a hydrogen atom (—H) is substituted with a monovalent group and a case where a methylene group (—$CH_2$—) is substituted with a divalent group.

The term "exposure" is a concept including irradiation with radiation as a whole.

The term "α-position (carbon atom at α-position)" means a carbon atom to which a side chain of a block copolymer is bonded, unless otherwise specified. The "carbon atom at the α-position" of the methyl methacrylate unit means a carbon atom to which a carbonyl group of methacrylic acid is bonded. The "carbon atom at the α-position" of the styrene unit means a carbon atom to which a benzene ring is bonded.

The term"number-average molecular weight" (Mn) is a number-average molecular weight in terms of standard polystyrene measured by size-exclusion chromatography, unless otherwise specified. The term "mass-average molecular weight" (Mw) is a mass-average molecular weight in terms of standard polystyrene measured by size-exclusion chromatography, unless otherwise specified. A value obtained by adding a unit (gmol⁻) to the value of Mn or Mw represents a molar mass.

In the present specification and claims, there may be an asymmetric carbon depending on the structure represented by the chemical formula, and an enantiomer or a diastereomer may exist, and in that case, these isomers are represented by one formula. These isomers may be used alone or used as a mixture.

Resin Composition for Forming Phase-Separated Structure

A resin composition for forming a phase-separated structure of the present embodiment contains a block copolymer having a first block and a second block. The first block includes a polymer having a repeating structure of a constituent unit represented by General Formula (b1). The second block includes a random copolymer having a structure in which a constituent unit represented by General Formula (b2m) and a constituent unit represented by General Formula (b2g) are arranged in a disorderly manner. A ratio of a volume of the first block to a total volume of the first block and the second block is 20% to 80% by volume.

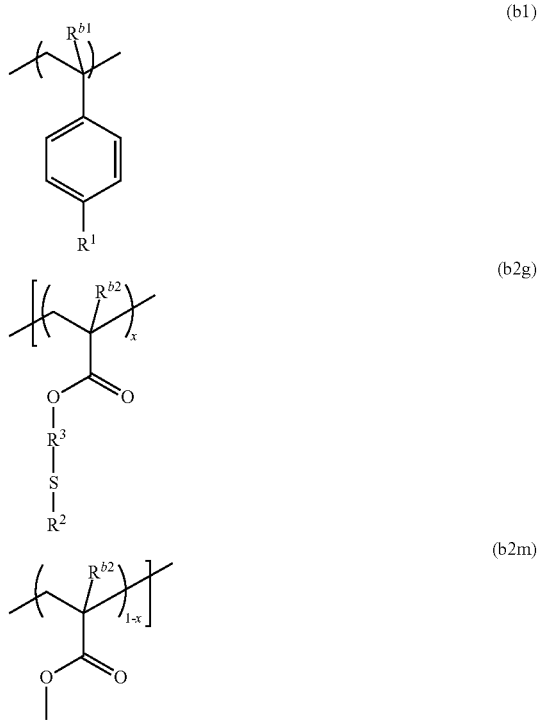

[In Formula (b1), $R^1$ is a hydrogen atom or an alkyl group. $R^{b1}$ is a hydrogen atom or a methyl group.

In Formula (b2g), $R^2$ is an alkyl group which may have a silicon atom, a fluorine atom, a carboxy group, an amino group, a hydroxy group, or a phosphoric acid group.

$R^3$ is a linear or branched alkylene group having 1 to 10 carbon atoms, which may have a hydroxy group.

In Formula (b2g) and Formula (b2m), $R^{b2}$ is a hydrogen atom, an alkyl group having 1 to 5 carbon atoms, or a halogenated alkyl group having 1 to 5 carbon atoms. A plurality of $R^{b2}$s may be the same or different from each other.

x and 1-x represent a molar ratio, and x is 0.1 or more and 0.9 or less.]

Block Copolymer: (BCP) Component

The block copolymer is a polymer in which a plurality of types of blocks (partial structural components in which structural units of the same type are repeatedly bonded) are bonded. The number of types of blocks constituting the block copolymer may be two or more, or three or more.

The block copolymer (hereinafter, also referred to as a "(BCP) component") in the present embodiment has the first block and the second block.

First Block

The first block includes a polymer having a repeating structure of a constituent unit (hereinafter, referred to as a constituent unit (b1)) represented by General Formula (b1).

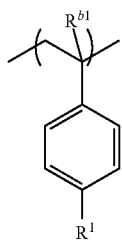

(b1)

[In Formula (b1), $R^1$ is a hydrogen atom or an alkyl group. $R^{b1}$ is a hydrogen atom or a methyl group.]

Here, in Formula (b1), $R^1$ is a hydrogen atom or an alkyl group. The alkyl group preferably has 1 to 5 carbon atoms, more preferably 1 to 4 carbon atoms, even more preferably 1 to 3 carbon atoms, and still even more preferably an ethyl group or a methyl group. $R^1$ is particularly preferably a hydrogen atom or a methyl group.

In Formula (b1), $R^{b1}$ is a hydrogen atom or a methyl group.

Second Block

The second block includes a random copolymer having a structure in which a constituent unit (hereinafter, referred to as a constituent unit (b2m)) represented by General Formula (b2m) and a constituent unit (hereinafter, referred to as a constituent unit (b2g)) represented by General Formula (b2g) are arranged in a disorderly manner.

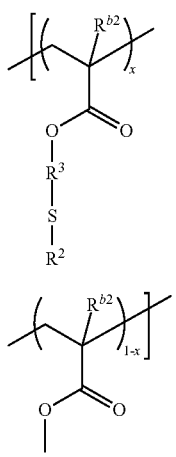

[In Formula (b2g), $R^2$ is an alkyl group which may have a silicon atom, a fluorine atom, a carboxy group, an amino group, a hydroxy group, or a phosphoric acid group.

$R^3$ is a linear or branched alkylene group having 1 to 10 carbon atoms, which may have a hydroxy group.

In Formula (b2g) and Formula (b2m), $R^{b2}$ is a hydrogen atom, an alkyl group having 1 to 5 carbon atoms, or a halogenated alkyl group having 1 to 5 carbon atoms. A plurality of $R^{b2}$s may be the same or different from each other.

x and 1-x represent a molar ratio, and x is 0.1 or more and 0.9 or less.]

Constituent Unit (b2m)

The constituent unit (b2m) is a constituent unit represented by General Formula (b2m).

In Formula (b2m), $R^{b2}$ is a hydrogen atom, an alkyl group having 1 to 5 carbon atoms, or a halogenated alkyl group having 1 to 5 carbon atoms. The alkyl group having 1 to 5 carbon atoms of $R^{b2}$ is preferably a linear or branched alkyl group having 1 to 5 carbon atoms, and specifically, exemplary examples thereof include a methyl group, an ethyl group, a propyl group, an isopropyl group, or an n-butyl group, an isobutyl group, a tert-butyl group, a pentyl group, an isopentyl group, a neopentyl group, and the like. The halogenated alkyl group having 1 to 5 carbon atoms is a group in which a part or all of the hydrogen atoms of the alkyl group having 1 to 5 carbon atoms are substituted with a halogen atom. As the halogen atom, a fluorine atom is particularly preferable.

As $R^{b2}$, a hydrogen atom, an alkyl group having 1 to 5 carbon atoms, or a fluorinated alkyl group having 1 to 5 carbon atoms is preferable, a hydrogen atom or a methyl group is more preferable from the viewpoint of industrial availability, and a methyl group is even more preferable.

Constituent Unit (b2g)

The constituent unit (b2g) is a constituent unit represented by General Formula (b2g).

In Formula (b2g), $R^{b2}$ is a hydrogen atom, an alkyl group having 1 to 5 carbon atoms, or a halogenated alkyl group having 1 to 5 carbon atoms. $R^{b2}$ is the same as $R^{b2}$ in Formula (b2m).

Here, in Formula (b2g), $R^2$ is an alkyl group which may have a silicon atom, a fluorine atom, a carboxy group, an amino group, a hydroxy group, or a phosphoric acid group. The alkyl group is preferably a linear or branched alkyl group, and more preferably a linear alkyl group. In a case where the alkyl group is linear, the number of carbon atoms may be one or more, but two or more carbon atoms are preferable. The upper limit of the number of carbon atoms of the linear alkylene group is not particularly limited, but from the viewpoint of phase separation performance, the number of carbon atoms is preferably 15 or less, more preferably 10 or less, even more preferably 8 or less, still even more preferably 6 or less, and particularly preferably 5 or less. In a case where the alkyl group is branched, the number of carbon atoms may be three or more. The upper limit of the number of carbon atoms of the branched alkyl group is not particularly limited, but from the viewpoint of phase separation performance, the number of carbon atoms is preferably 15 or less, more preferably 10 or less, even more preferably 8 or less, still even more preferably 6 or less, and particularly preferably 5 or less. The number of carbon atoms of the alkyl group is preferably 2 to 15 carbon atoms, more preferably 2 to 10 carbon atoms, even more preferably 2 to 8 carbon atoms, still even more preferably 2 to 6 carbon atoms, and particularly preferably 2 to 5 carbon atoms.

The alkyl group of $R^2$ is preferably a linear alkyl group having 2 to 5 carbon atoms.

The alkyl group of $R^2$ may have a silicon atom, a fluorine atom, a carboxy group, an amino group, a hydroxy group, or a phosphoric acid group. In a case where the alkyl group of $R^2$ has a fluorine atom, a carboxy group, an amino group, a hydroxy group, or a phosphoric acid group, the fluorine atom, the carboxy group, the amino group, the hydroxy group, or the phosphoric acid group may be a substituent used for substituting a hydrogen atom of the alkyl group. The number of hydrogen atoms substituted with the above groups is not particularly limited, but is preferably 1 to 3. In a case where the alkyl group of $R^2$ has a silicon atom, the silicon atom may be a substituent used for substituting a methylene group (—$CH_2$—) in the alkyl group. The number of methylene groups substituted with the silicon atom is not particularly limited, but is preferably one.

$R^2$ is preferably an alkyl group which may be substituted with an alkylsilyl group, a fluoromethyl group, a carboxy group, an amino group, a hydroxy group, or a phosphoric acid group. An alkyl group in the alkylsilyl group preferably has 1 to 3 carbon atoms, and more preferably 1 or 2 carbon atoms. The alkylsilyl group is preferably a trialkylsilyl group, more preferably a triethylsilyl group or a trimethylsilyl group, and even more preferably a trimethylsilyl group. The fluoromethyl group is preferably a trifluoromethyl group.

Preferred examples of $R^2$ are described below, but $R^2$ is not limited thereto. In the following Formulae, * is a bond that binds to a sulfur atom (S) in Formula (b2g).

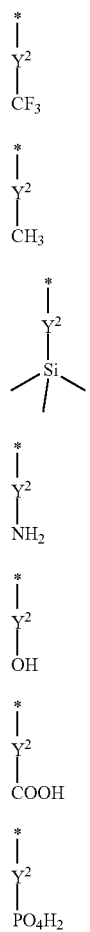

[In Formulae, $Y^2$ is a linear or branched alkylene group having 1 to 15 carbon atoms.]

In Formulae (r2-1) to (r2-7), $Y^2$ is a linear or branched alkylene group having 1 to 15 carbon atoms. In a case where the alkylene group is linear, the linear alkylene group more preferably has 1 to 10 carbon atoms, even more preferably has 1 to 8 carbon atoms, and particularly preferably has 1 to 5 carbon atoms. In a case where the alkylene group is branched, the branched alkylene group more preferably has 2 to 10 carbon atoms, even more preferably has 2 to 8 carbon atoms, and particularly preferably has 2 to 5 carbon atoms.

The alkylene group of $Y^2$ is preferably a linear alkylene group having 1 to 5 carbon atoms.

Specific examples of $R^2$ are described below, but $R^2$ is not limited thereto. In the following Formulae, * is a bond that binds to a sulfur atom (S) in Formula (b2g).

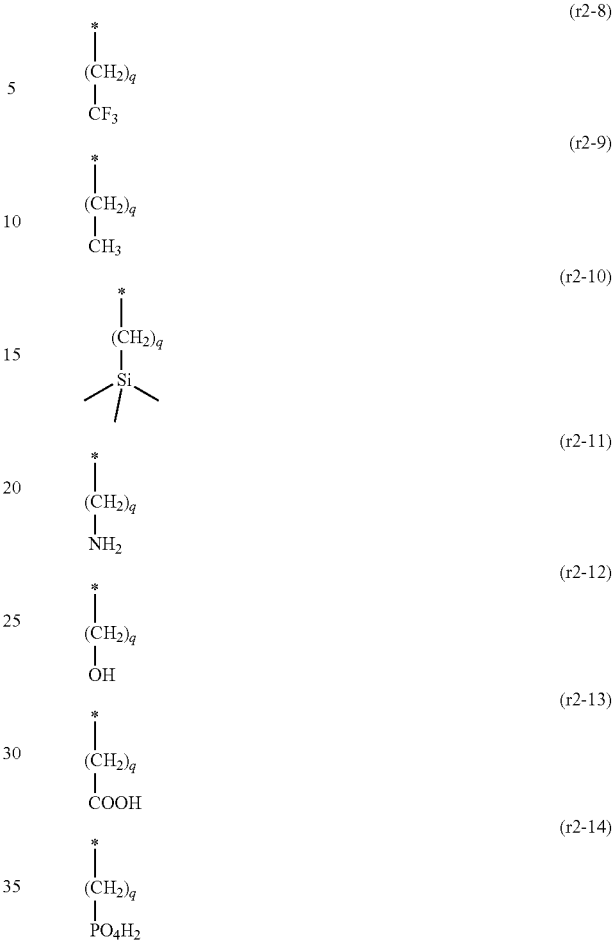

[In Formulae, q is an integer 1 to 15.]

In Formulae, q is preferably 1 to 10, more preferably 1 to 8, even more preferably 1 to 6, and particularly preferably 1 to 5.

In Formula (b2g), $R^3$ is a linear or branched alkylene group having 1 to 10 carbon atoms, which may have a hydroxy group. In a case where the alkylene group is linear, the number of carbon atoms may be one or more, but three or more carbon atoms are preferable. From the viewpoint of phase separation performance, the upper limit of the number of carbon atoms of the linear alkylene group is preferably 8 carbon atoms or less, more preferably 5 carbon atoms or less, and even more preferably 4 carbon atoms or less. The number of carbon atoms of the linear alkylene group is particularly preferably 3 carbon atoms. In a case where the alkylene group is branched, the number of carbon atoms may be three or more, but four or more carbon atoms are preferable. From the viewpoint of phase separation performance, the upper limit of the number of carbon atoms of the branched alkylene group is preferably 8 carbon atoms or less, and more preferably 5 carbon atoms or less. The number of carbon atoms of the alkyl group is preferably 3 to 10 carbon atoms, more preferably 3 to 8 carbon atoms, even more preferably 3 to 5 carbon atoms, still even more preferably 3 and 4 carbon atoms, and particularly preferably 3 carbon atoms.

The alkylene group of $R^3$ is preferably a linear alkylene group having 3 carbon atoms.

The alkylene group of $R^3$ may have a hydroxy group. The hydroxy group may be a substituent used for substituting a hydrogen atom of the alkylene group. The number of hydrogen atoms substituted with the hydroxy group is not particularly limited, but is preferably 1 to 3, more preferably 1 or 2, and even more preferably 1.

The constituent unit (b2g) is preferably a constituent unit represented by General Formula (b2g-1).

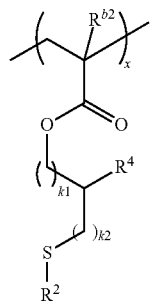

(b2g-1)

[In Formula (b2g-1), $R^4$ is a hydrogen atom or a hydroxy group. k1 and k2 are each independently an integer of 1 to 5. $R^{b2}$ and $R^2$ are the same as $R^{b2}$ and $R^2$ in Formula (b2g).]

In Formula (b2g-1), $R^{b2}$ and $R^2$ are the same as $R^{b2}$ and $R^2$ in Formula (b2g). $R^2$ is preferably represented by Formulae (r2-1) to (r2-7), and more preferably represented by Formulae (r2-8) to (r2-14).

In Formula (b2g-1), $R^4$ is a hydrogen atom or a hydroxy group.

In Formula (b2g-1), k1 and k2 are each independently an integer of 1 to 5. Each of k1 and k2 is preferably 1 to 3, more preferably 1 or 2, and even more preferably 1.

Specific examples of the constituent unit (b2g) are described below, but the constituent unit (b2g) is not limited thereto. In the following Formulae, R represents a methyl group or a hydrogen atom, and a methyl group is preferable.

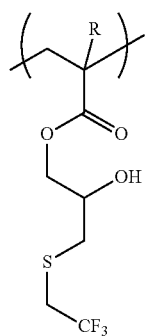

(b2g-1-1)

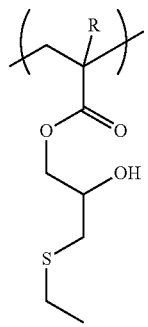

(b2g-1-2)

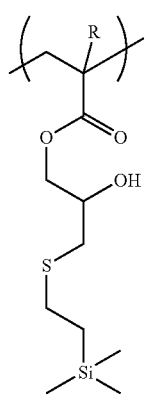

(b2g-1-3)

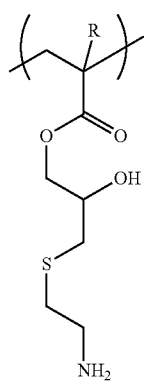

(b2g-1-4)

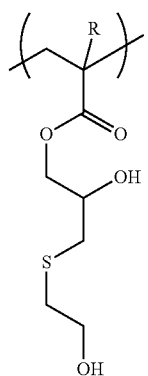

(b2g-1-5)

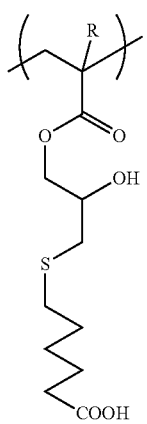
(b2g-1-6)
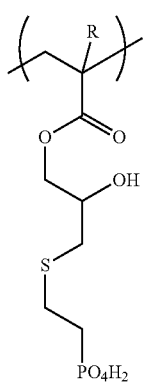
(b2g-1-7)
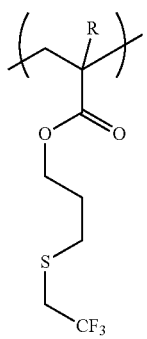
(b2g-1-8)
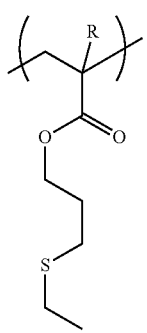
(b2g-1-9)
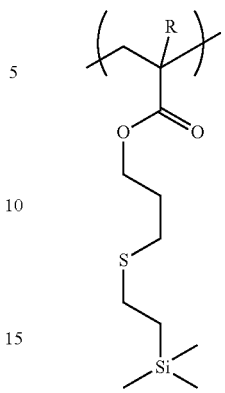
(b2g-1-10)
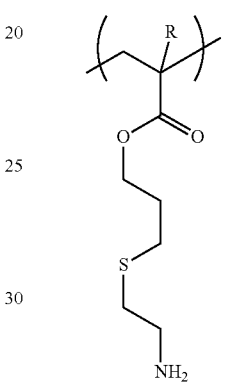
(b2g-1-11)
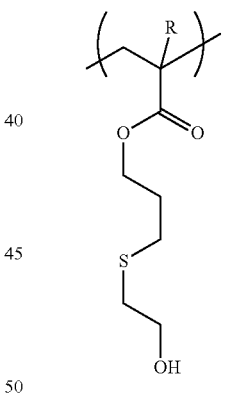
(b2g-1-12)
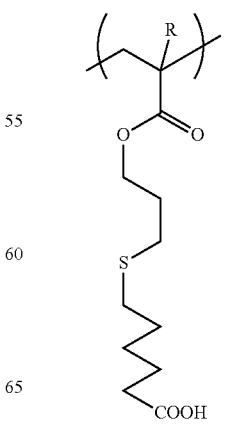
(b2g-1-13)

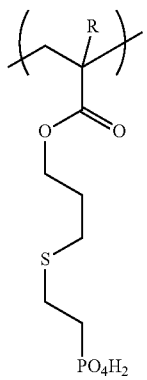

(b2g-1-14)

The second block includes a random copolymer having a structure in which the constituent unit (b2g) and the constituent unit (b2m) are arranged in a disorderly manner. In Formulae (b2g) and (b3m), x and 1-x represent a molar ratio of the constituent unit (b2g) and the constituent unit (b2m). x is 0.1 or more and 0.9 or less. x is preferably 0.8 or less, and more preferably 0.7 or less. The lower limit of x is preferably 0.15 or more, and more preferably 0.2 or more. x is preferably 0.15 to 0.8, more preferably 0.2 to 0.7, and further more preferably more than 0.2 and 0.7 or less.

In the (BCP) component, a ratio of a volume of the first block to a total volume of the first block and the second block is 20% to 80% by volume. The ratio of the volume of the first block is preferably 30% by volume or more, and more preferably 35% by volume or more. The upper limit of the ratio of the volume of the first block is preferably 70% by volume or less, more preferably 65% by volume or less, and even more preferably 60% by volume or less.

The ratio of the volume of the first block to the total volume of the first block and the second block in the (BCP) component can be obtained as follows.

From an analysis result of $^1$H NMR, the % by mol of each of the first block and the second block in the (BCP) component is calculated, and furthermore, the % by mass of each block is calculated from a molecular weight of each block. The % by mass of each block is divided by a density of each block to calculate a ratio of a volume of each block, and the % by volume of the first block in the (BC) component is calculated from the ratio of the volume. A density of each block can be estimated by the atomic group contribution method (Fedors, R. F. Polym. Eng. Sci. 1974, 14, 147-154). In a case where the first block is a polystyrene block (PS), a density of PS of 1.05 $gm^{-3}$ can be used. In a case where the second block is a polystyrene block (PS), a density of PS of 1.05 $gm^{-3}$ can be used. In a case where the second block has a constituent unit induced from methyl methacrylate, 1.18 $gcm^{-3}$ can be used as a density of the structure constituted of the constituent unit. In a case where the second block has a constituent unit induced from 2-hydroxy-3-(2,2,2-trifluoroethylsulfanyl)propyl methacrylate, 1.43 $gcm^{-3}$ can be used as a density of the structure constituted of the constituent unit. As for the density of each block, densities described in literatures (Polymer Handbook, 4th ed.; Wiley: New York, 2004) and the like can also be used.

The (BCP) component may have other blocks in addition to the first block and the second block. In a preferred aspect, the (BCP) component is a block copolymer having a first block and a second block.

The number-average molecular weight (Mn) of the (BCP) component (in terms of standard polystyrene measured by size-exclusion chromatography) is not particularly limited, and is preferably 3,000 to 100,000, more preferably 5,000 to 50,000, even more preferably 6,000 to 40,000, and particularly preferably 8,000 to 30,000.

The molecular weight dispersion (Mw/Mn) of each block constituting the (BCP) component is preferably 1.0 to 1.5, more preferably 1.0 to 1.4, and even more preferably 1.0 to 1.3.

Method for Producing Block Copolymer ((BCP) Component)

The (BCP) component can be produced by, for example, a production method including the following steps.

Step (p1): a step of obtaining a block copolymer having the first block and a precursor of the second block (hereinafter, also referred to as a "BCP precursor")

Step (p2): a step of obtaining a block copolymer ((BCP) component) containing the first block and the second block by the precursor of the second block in the BCP precursor being reacted with a compound represented by $R^2$—SH ($R^2$ is the same as $R^2$ in Formula (b2g)).

Step (p1):

The precursor of the second block is a random copolymer having a structure in which a constituent unit (b2gp) that is a precursor of the constituent unit (b2g) and the constituent unit (b2m) are arranged in a disorderly manner. The constituent unit (b2gp) is a constituent unit containing an epoxy group or a vinyl group, and an exemplary example thereof includes a constituent unit represented by General Formula (b2gp).

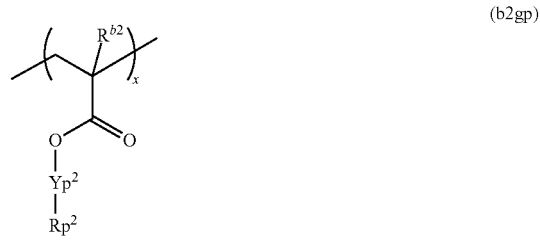

(b2gp)

[In Formula (b2gp), $Rp^2$ represents an epoxy group or a vinyl group. $Yp^2$ represents a linear or branched alkylene group having 1 to 8 carbon atoms. $R^{b2}$ is a hydrogen atom, an alkyl group having 1 to 5 carbon atoms, or a halogenated alkyl group having 1 to 5 carbon atoms.]

The BCP precursor can be obtained by, for example, carrying out a polymerization reaction of a monomer for inducing the constituent unit (b1) (for example, styrene or a derivative thereof; hereinafter, the monomer is also referred to as a monomer (b1)), and thereafter, adding a monomer for inducing the constituent unit (b2gp) (for example, glycidyl methacrylate, allyl methacrylate, and the like; hereinafter, the monomer is also referred to as a monomer (b2gp)) and a monomer for inducing the constituent unit (b2m) (for example, methyl methacrylate; hereinafter, the monomer is also referred to as a monomer (b2m)) to the polymerization reaction solution, and further carrying out a polymerization reaction. Alternatively, the BCP precursor can be obtained by carrying out a polymerization reaction with a mixture of the monomer (b2gp) and the monomer (b2m), and thereafter, adding the monomer (b1) to the polymerization reaction solution, and further carrying out a polymerization reaction. As the polymerization reaction, living polymerization is preferable because it is easy to synthesize with narrow dispersion. As a preferable living polymerization method, living anionic polymerization and living radical polymerization are exemplary examples, and living anionic polymerization is particularly preferable since the narrow dispersion can be further achieved.

Step (p2):

The compound represented by $R^2$—SH (hereinafter, also referred to as a "compound ($R^2$—SH)") is a compound obtained by reacting the compound with an epoxy group or a vinyl group of the constituent unit (b2gp), and converting the constituent unit (b2gp) into the constituent unit (b2g).

In a case where the constituent unit (b2gp) contains an epoxy group, the reaction between the BCP precursor and the compound ($R^2$—SH) can be carried out in an organic solvent such as tetrahydrofuran in the presence of a catalyst such as lithium hydroxide. Exemplary examples of a reaction temperature include 20° C. to 60° C., and 30° C. to 50° C. is preferable, and 35° C. to 45° C. is more preferable. A reaction time can be appropriately set according to the amount of the BCP precursor used, and may be sufficient to convert all the constituent units (b2gp) in the precursor of the second block into the constituent units (b2g). Exemplary examples of the reaction time include 1 to 10 hours. In a case where the constituent unit (b2gp) contains a vinyl group, the reaction between the BCP precursor and the compound ($R^2$—SH) can be carried out by a thiol-ene reaction. The thiol-ene reaction can be carried out in an organic solvent such as tetrahydrofuran in the presence of a catalyst such as azobisisobutyronitrile (AIBN). Exemplary examples of a reaction temperature include 60° C. to 90° C., and 70° C. to 90° C. is preferable, and 75° C. to 85° C. is more preferable. A reaction time can be appropriately set according to the amount of the BCP precursor used, and may be sufficient to convert all the constituent units (b2gp) in the precursor of the second block into the constituent units (b2g). Exemplary examples of the reaction time include 1 to 10 hours.

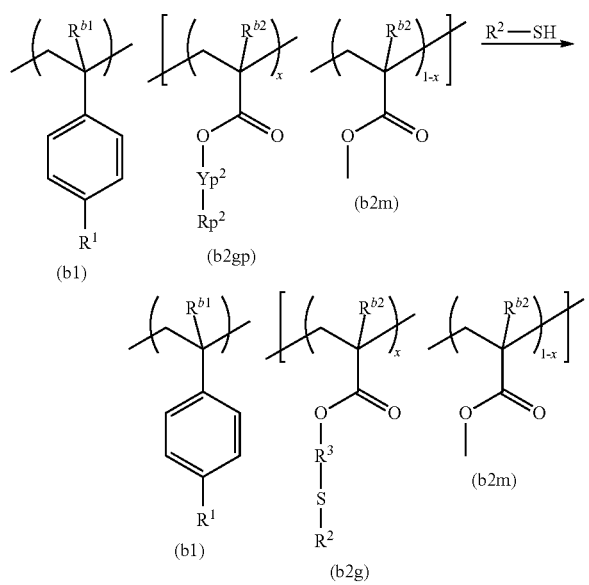

[In Formulae, $R^1$ and $R^{b1}$ are the same as $R^1$ and $R^{b1}$ in Formula (b1). $R^2$ and $R^3$ are the same as $R^2$ and $R^3$ in Formula (b2g). $R^{b2}$ and x are the same as $R^{b2}$ and x in Formula (b2g) and Formula (b2m). $Yp^1$ represents a linear or branched alkyl group having 1 to 8 carbon atoms. $Rp^t$ represents an epoxy group or a vinyl group.]

Organic Solvent Component

The resin composition for forming a phase-separated structure of the embodiment can be prepared by dissolving the (BCP) component in an organic solvent component.

Any organic solvent component may be used as long as it can dissolve each component to be used and form a homogeneous solution, and arbitrary solvents may be selected from any solvents known in the related art as a solvent for a film composition including a resin as a main component.

Exemplary examples of the organic solvent component include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, and dipropylene glycol; a compound having an ester bond such as ethylene glycol monoacetate, diethylene glycol monoacetate, propylene glycol monoacetate, and dipropylene glycol monoacetate; derivatives of polyhydric alcohols such as compounds having an ether bond such as monoalkyl ethers such as monomethyl ether, monoethyl ether, monopropyl ether, and monobutyl ether or monophenyl ether of the polyhydric alcohols or compounds having an ester bond [among these, propylene glycol monomethyl ether acetate (PGMEA) and propylene glycol monomethyl ether (PGME) are preferable]; cyclic ethers such as dioxane, or esters such as methyl lactate, ethyl lactate (EL), methyl acetate, ethyl acetate, butyl acetate, methyl pyruvate, ethyl pyruvate, methyl methoxy propionate, and ethyl ethoxy propionate; aromatic organic solvents such as anisole, ethyl benzyl ether, cresyl methyl ether, diphenyl ether, dibenzyl ether, phenetole, butyl phenyl ether, ethyl benzene, diethyl benzene, pentyl benzene, isopropyl benzene, toluene, xylene, cymene, and mesitylene.

The organic solvent components may be used alone or as a mixed solvent of two or more kinds thereof. Among these, propylene glycol monomethyl ether acetate (PGMEA), propylene glycol monomethyl ether (PGME), cyclohexanone, and EL are preferable.

A mixed solvent which is obtained by mixing PGMEA and a polar solvent is also preferable. The blending ratio (mass ratio) may be appropriately determined in consideration of compatibility between PGMEA and the polar solvent, and it is preferably in a range of 1:9 to 9:1 and more preferably 2:8 to 8:2.

For example, in a case where EL is blended as a polar solvent, the mass ratio of PGMEA:EL is preferably 1:9 to 9:1 and more preferably 2:8 to 8:2. In a case where PGME is blended as the polar solvent, the mass ratio of PGMEA:PGME is preferably 1:9 to 9:1, more preferably 2:8 to 8:2, and even more preferably 3:7 to 7:3. In a case where PGME and cyclohexanone are blended as a polar solvent, the mass ratio of PGMEA:(PGME+cyclohexanone) is preferably 1:9 to 9:1, more preferably 2:8 to 8:2, and even more preferably 3:7 to 7:3.

As the organic solvent component in the resin composition for forming a phase-separated structure, in addition to those components, a mixed solvent in which PGMEA, EL, or the mixed solvent of PGMEA and a polar solvent is mixed with γ-butyrolactone is also preferable. In this case, the mass ratio of the former to the latter is, as the mixing ratio, preferably 70:30 to 95:5.

The concentration of the organic solvent component included in the resin composition for forming a phase-separated structure is not particularly limited, and the component is appropriately set at a concentration with which the coating can be performed according to the coating film thickness. The solid content concentration is generally used in a range of 0.2% to 70% by mass and preferably in a range of 0.2% to 50% by mass.

Optional Component

The resin composition for forming a phase-separated structure may appropriately include, as desired, miscible additives such as additional resins for improving the layer performance, surfactants for improving coatability, a dissolution inhibitor, a plasticizer, a stabilizer, a colorant, a halation inhibitor, a dye, a sensitizer, a base proliferating agent, and a basic compound, in addition to the above-mentioned (BCP) component and the organic solvent component.

According to the resin composition for forming a phase-separated structure of the present embodiment described above, since the second block of the (BCP) component has the constituent unit (b2gp), the value of $\chi$ can be increased as compared with the block copolymer (PS-b-PMMA) having the block of styrene and the block of methyl methacrylate in the related art.

In a case where the block copolymer satisfies Formula (2), the tendency of phase separation is stronger. In the following Formula, $\chi$ represents the Flory-Huggins interaction parameter, and N represents a degree of polymerization. According to Formula (2), even a block copolymer having a low degree of polymerization (N) can be phase-separated by the value of $\chi$ being increased.

$$\chi \times N > 10.5 \quad (2)$$

On the other hand, the period (L0) of the block copolymer is substantially proportional to $N^{2/3} \times \chi^{1/6}$ as shown in Formula (1). Therefore, since the block copolymer has the lower N value, a fine phase-separated structure having a shorter period can be formed.

According to the resin composition for forming a phase-separated structure of the embodiment, since the second block of the (BCP) component is the random copolymer having the constituent unit (b2m) and the constituent unit (b2gp) that increases the value of $\chi$ and having the structure in which both of the constituent units are arranged in a disorderly manner, it is possible to achieve both the high $\chi$ value and the improvement of the vertical orientation of the phase-separated structure by the control of the composition ratio of the constituent units (b2gm), and it is possible to reduce defects.

Method for Producing Structure Including Phase-Separated Structure

The method for producing a structure including a phase-separated structure according to the embodiment includes a step of applying a resin composition for forming a phase-separated structure of the above embodiment on a support to form a layer including a block copolymer (hereinafter, referred to as "step (i)") and a step of phase-separating the layer including the block copolymer (hereinafter, referred to as "step (ii)").

Hereinafter, a method for producing a structure including a phase-separated structure will be described in detail with reference to FIG. 1. However, the present invention is not limited thereto.

FIG. 1 shows an embodiment of a method for producing a structure including a phase-separated structure.

In the embodiment shown in FIG. 1, first, an undercoat agent layer 2 is formed by applying an undercoat agent on a support 1 (FIG. 1 (I)).

Next, the layer (BCP layer) 3 including the (BCP) component is formed by applying the resin composition for forming a phase-separated structure of the above-described embodiment on the undercoat agent layer 2 (FIG. 1 (II); the above, step (i)).

Next, the BCP layer 3 is phase-separated into the phase 3a and the phase 3b by heating and annealing treatment (FIG. 1 (III); step (ii)).

According to the production method of this embodiment, that is, the production method including step (i) and step (ii), the structure 3' including the phase-separated structure is produced on the support 1 on which the undercoat agent layer 2 is formed.

Step (i)

In step (i), the BCP layer 3 is formed by applying a resin composition for forming a phase-separated structure on the support 1.

In the embodiment shown in FIG. 1, first, the undercoat agent layer 2 is formed by applying the undercoat agent on the support 1.

By providing the undercoat agent layer 2 on the support 1, a hydrophilic/hydrophobic balance between the surface of the support 1 and the layer (BCP layer) 3 including the block copolymer can be achieved.

That is, in a case where the undercoat agent layer 2 includes a resin component having the constituent unit constituting the block (b1), the adhesiveness between the phase having the block (b1) of the BCP layer 3 and the support 1 is enhanced. In a case where the undercoat agent layer 2 includes a resin component having the constituent unit constituting the block (b2), the adhesiveness between the phase having the block (b2) of the BCP layer 3 and the support 1 is enhanced.

Accordingly, a cylinder structure oriented in the direction perpendicular to the surface of the support 1 is likely to be formed due to the phase separation of the BCP layer 3.

Undercoat Agent:

A resin composition can be used as an undercoat agent.

The resin composition for the undercoat agent can be appropriately selected from the resin compositions known in the related art used for forming a thin film depending on the type of the block constituting the (BCP) component.

The resin composition for the undercoat agent may be, for example, a thermopolymerizable resin composition or may be a photosensitive resin composition such as a positive-type resist composition or a negative-type resist composition. In addition, a non-polymerizable film formed by applying the compound as a surface treating agent may be used as an undercoat agent layer. For example, a siloxane-based organic monomolecular film formed by applying phenethyltrichlorosilane, octadecyltrichlorosilane, hexamethyldisilazane, or the like as a surface-treating agent can also be suitably used as an undercoat agent layer.

Exemplary examples of such a resin composition include a resin composition including a resin having any of the constituent units constituting each of the block (b1) and the block (b2), a resin composition including a resin having both each block constituting the (BCP) component and a constituent unit having a high affinity, and the like.

As a resin composition for the undercoat agent, for example, a composition including a resin having both styrene and methyl methacrylate as a constituent unit and a compound or a composition including both a site having a high affinity with styrene such as an aromatic ring and a site having a high affinity with methyl methacrylate (such as a highly polar functional group) are preferably used.

As a resin having both styrene and methyl methacrylate as a constituent unit, a random copolymer of styrene and methyl methacrylate, an alternating polymer of styrene and methyl methacrylate (the polymer in which each monomer is alternately copolymerized), and the like are exemplary examples.

In addition, as a composition including both a site having a high affinity with styrene and a site having a high affinity with methyl methacrylate, for example, a composition containing a resin obtained by polymerizing at least, as a monomer, a monomer having an aromatic ring and a monomer having a high polarity functional group is an exemplary example. As the monomer having an aromatic ring, a monomer having an aryl group obtained by removing a hydrogen atom from an aromatic hydrocarbon ring, such as a phenyl group, a biphenyl group, a fluorenyl group, a naphthyl group, an anthryl group, and a phenanthryl group, or a heteroaryl group in which carbon atoms constituting the ring of these groups are partially substituted with a hetero atom such as an oxygen atom, a sulfur atom or a nitrogen atom are exemplary examples. In addition, as a monomer having a highly polar functional group, a monomer having a trimethoxysilyl group, a trichlorosilyl group, an epoxy group, a glycidyl group, a carboxy group, a hydroxy group, a cyano group, a hydroxyalkyl group in which the hydrogen atoms of the alkyl group are partially substituted with a hydroxyl group, and the like are exemplary examples.

Further, as a compound including both a site having a high affinity with styrene and a site having a high affinity with methyl methacrylate, a compound including both an aryl group such as phenethyltrichlorosilane and a highly polar functional group, or a compound including both an alkyl group such as an alkylsilane compound and a highly polar functional group, and the like are exemplary examples.

The resin composition for the undercoat agent can be produced by dissolving the above-mentioned resin in a solvent.

As such a solvent, any solvent may be used as long as it can dissolve each component to be used and form a homogeneous solution. For example, the same organic solvent components as exemplified in the description of the resin composition for forming a phase-separated structure of the above-described embodiment are exemplary examples.

The type of the support 1 is not particularly limited as long as the resin composition can be applied on its surface. For example, a substrate made of an inorganic material such as a metal (silicon, copper, chromium, iron, and aluminum), glass, titanium oxide, silica or mica; a substrate made of an oxide such as $SiO_2$; a substrate made of a nitride such as SiN; a substrate made of an oxynitride such as SiON; and a substrate made of an organic material such as acryl, polystyrene, cellulose, cellulose acetate, phenolic resin, and the like are exemplary examples. Among these, a metal substrate is suitable, and for example, a structure of a cylinder structure is likely to be formed in a silicon substrate (Si substrate) or a copper substrate (Cu substrate). Among these, a Si substrate is particularly suitable.

The size and shape of the support 1 are not particularly limited. The support 1 is not necessarily required to have a smooth surface, and substrates of various shapes can be appropriately selected. For example, a substrate having a curved surface, a flat plate having an uneven surface, and a substrate with a flaky shape are exemplary examples.

An inorganic and/or organic film may be provided on the surface of the support 1.

As an inorganic film, an inorganic antireflection film (inorganic BARC) is an exemplary example. As an organic film, an organic antireflection film (organic BARC) is an exemplary example.

The inorganic film can be formed, for example, by applying an inorganic antireflection film composition such as a silicon-based material on a support and baking the film, and the like.

For example, the organic film is formed by applying a material for forming an organic film in which a resin component constituting the film is dissolved in an organic solvent on a substrate using a spinner or the like and baking the film under heating conditions of preferably 200° C. to 300° C., preferably for 30 to 300 seconds and more preferably for 60 to 180 seconds. The material for forming this organic film does not necessarily need to have sensitivity to light or electron beams such as a resist film, and may or may not have sensitivity. Specifically, a resist or a resin generally used for the production of a semiconductor element or a liquid crystal display element can be used.

In addition, it is preferable that the material for forming an organic film be a material capable of forming an organic film which can be subjected to etching, particularly dry-etching so that the organic film can be etched through the pattern made of the block copolymer, formed by processing the BCP layer 3 and the pattern can be transferred on the organic film to form an organic film pattern. Among these, a material capable of forming an organic film capable of being subjected to etching such as oxygen plasma etching is preferable. Such a material for forming an organic film may be a material used for forming an organic film such as organic BARC in the related art. For example, the ARC series manufactured by NISSAN CHEMICAL INDUSTRIES, LTD., the AR series manufactured by Rohm and Haas Japan Ltd., and the SWK series manufactured by TOKYO OHKA KOGYO CO., LTD. and the like are exemplary examples.

The method for forming the undercoat agent layer 2 by applying the undercoat agent on the support 1 is not particularly limited and the undercoat agent layer 2 can be formed by a known method in the related art.

For example, the undercoat agent layer 2 can be formed by applying the undercoat agent on the support 1 by a known method in the related art such as using a spin coating or a spinner to form a coating film, and drying the coating film.

As a method for drying the coating film, any method for drying the coating film may be used as long as the solvent included in the undercoat agent can be volatilized, and for example, a method for baking the coating film is an exemplary example. In this case, the baking temperature is preferably 80° C. to 300° C., more preferably 180° C. to 270° C., and even more preferably 220° C. to 250° C. The baking time is preferably 30 to 500 seconds and more preferably 60 to 400 seconds.

The thickness of the undercoat agent layer 2 after drying the coating film is preferably about 10 to 100 nm and more preferably about 40 to 90 nm.

The surface of the support 1 may be cleaned in advance before forming the undercoat agent layer 2 on the support 1. The coatability of the undercoat agent is improved by cleaning the surface of the support 1.

As the cleaning treatment method, known methods in the related art can be used, and examples thereof include oxygen plasma treatment, ozone oxidation treatment, acid alkali treatment, chemical modification treatment, and the like.

After the undercoat agent layer 2 is formed, the undercoat agent layer 2 may be rinsed with a rinsing liquid such as a solvent, as necessary. Since the uncrosslinked portion of the undercoat agent layer 2 is removed by the rinsing, the affinity with at least one block constituting the block copolymer is improved, and therefore, a phase-separated structure having a cylinder structure oriented in the direction perpendicular to the surface of the support 1 is likely to be formed.

The rinsing liquid may be any one as long as it can dissolve the uncrosslinked portion and may be a solvent such as propylene glycol monomethyl ether acetate (PGMEA), propylene glycol monomethyl ether (PGME), ethyl lactate (EL) or a commercially available thinner liquid.

After the cleaning, post-baking may be performed in order to volatilize the rinsing liquid. The temperature condition of the post-baking is preferably 80° C. to 300° C., more preferably 100° C. to 270° C., and even more preferably 120° C. to 250° C. The baking time is preferably 30 to 500 seconds and more preferably 60 to 240 seconds. The thickness of the undercoat agent layer 2 after such post-baking is preferably about 1 to 10 nm and more preferably about 2 to 7 nm.

Next, the layer (BCP layer) 3 including the (BCP) component is formed on undercoat agent layer 2.

The method for forming the BCP layer 3 on the undercoat agent layer 2 is not particularly limited. For example, a method for forming the BCP layer 3 by applying a resin composition for forming a phase-separated structure of the above-described embodiment on the undercoat agent layer 2 by a known method in the related art such as using a spin coating or a spinner to form a coating film and drying the coating film is an exemplary example.

The thickness of the BCP layer 3 may be a thickness sufficient to cause phase separation, and the thickness is preferably 20 to 100 nm and more preferably 30 to 80 nm, in consideration of the type of the support 1, the structure period size of the phase-separated structure to be formed, or the uniformity of the nanostructure.

For example, in a case where the support 1 is a Si substrate, the thickness of the BCP layer 3 is preferably adjusted to 10 to 100 nm and more preferably 30 to 80 nm.

Step (ii)

In step (ii), the BCP layer 3 formed on the support 1 is phase-separated.

By heating to perform an annealing treatment of the support 1 after step (i), a phase-separated structure is formed so that at least a part of the surface of the support 1 is exposed by selective removal of the block copolymer. That is, a structure 3' including a phase-separated structure which is phase-separated into a phase 3a and a phase 3b is produced on the support 1.

The annealing treatment is preferably performed under the temperature condition of the glass transition temperature of the (BCP) component used or higher and lower than the thermal decomposition temperature. For example, in a case where the block copolymer is polystyrene-polymethyl methacrylate (PS-PMMA) block copolymer (mass-average molecular weight of 5,000 to 100,000), the temperature is preferably 180° C. to 270° C. A heating time is preferably 30 to 3600 seconds.

In addition, it is preferable that the annealing treatment be performed in a gas having low reactivity such as nitrogen.

According to the method for producing a structure including a phase-separated structure of the embodiment described above, since the resin composition for forming a phase-separated structure of the above embodiment is used, the phase separation performance of the block copolymer is further increased.

In addition, according to the method for producing a structure including a phase-separated structure of the embodiment, it is possible to produce a support having nanostructures whose positions and orientations are more freely designed on the surface of the support. For example, the formed structure has high adhesion to the support and tends to have a phase-separated structure having a cylinder structure oriented in the direction perpendicular to the surface of the support.

Optional Step

The method for producing a structure including a phase-separated structure is not limited to the above-described embodiment and may have a step (optional step) in addition to step (i) and step (ii).

This optional step includes a step (hereinafter, referred to as "step (iii)") of selectively removing a phase having at least one block of the block (b1) and the block (b2) constituting the (BCP) component of the BCP layer 3, a step of forming a guide pattern, and the like.

Regarding Step (iii)

In step (iii), the phase having at least one block of the block (b1) and the block (b2) constituting the (BCP) component of the BCP layer formed on the undercoat agent layer 2 is selectively removed. As a result, a fine pattern (polymer nanostructure) is formed.

As a method for selectively removing the phase having blocks, a method for performing oxygen plasma treatment on the BCP layer, a method for performing hydrogen plasma treatment and the like are exemplary examples.

For example, by performing oxygen plasma treatment, hydrogen plasma treatment or the like on the BCP layer after the phase separation of the BCP layer including the (BCP) component, the phase having the block (b1) is not selectively removed. The phase having the block (b2) is selectively removed.

Figure 2:
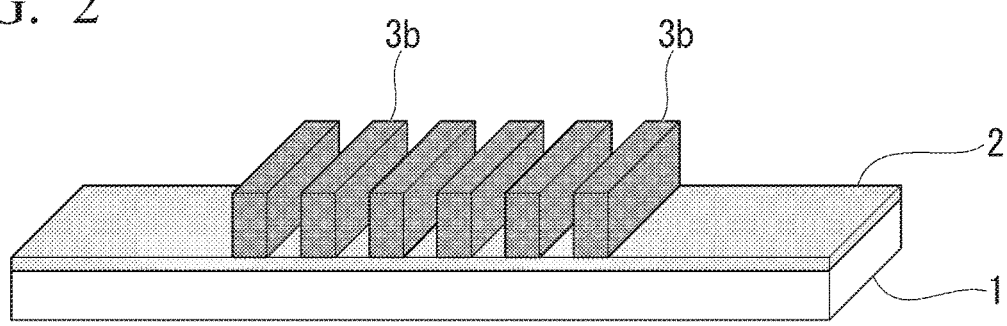
FIG. 2 is a diagram explaining an example of an embodiment of an optional step.

FIG. 2 shows an example of an embodiment of step (iii).

The embodiment shown in FIG. 2 is a case where the phase 3a is selectively removed and a pattern (polymer nanostructure) from the separated phase 3b is formed by performing oxygen plasma treatment on the structure 3' produced on the support 1 in step (ii). In this case, the phase 3b is a phase having the block (b1) and the phase 3a is a phase having the block (b2).

The support 1 having the patterns formed by the phase separation of the BCP layer 3 having the (BCP) component as described above can be used as it is, but the shape of the patterns (polymer nanostructure) of the support 1 may be changed by further heating.

The temperature condition for heating is the glass transition temperature of the block copolymer to be used or higher and is preferably lower than the thermal decomposition temperature. In addition, the heating is preferably performed in a gas having low reactivity such as nitrogen.

Regarding Guide Pattern Forming Step

In the method for producing a structure including a phase-separated structure, a step (guide pattern forming step) of forming a guide pattern on the undercoat agent layer may be provided between the above-described step (i) and step (ii). This makes it possible to control the array structure of the phase-separated structures.

For example, even with respect to a block copolymer in which a random fingerprint-shaped phase-separated structure is formed in a case where the guide pattern is not provided, a phase-separated structure oriented along the groove can be obtained by providing a groove structure of a resist film on the surface of the undercoat agent layer. According to such a principle, a guide pattern may be provided on the undercoat agent layer 2. Further, in the case where the surface of the guide pattern has an affinity with any of the blocks constituting the (BCP) component, a phase-separated structure having a cylinder structure oriented in the direction perpendicular to the surface of the support is likely to be formed.

The guide pattern can be formed using, for example, a resist composition.

As the resist composition for forming the guide pattern, generally, those having an affinity with any of the blocks constituting the (BCP) component can be appropriately selected for use from the resist compositions used for forming resist patterns or modified products thereof. The resist composition may be any of a positive-type resist composition for forming a positive-type pattern in which the exposed area of the resist film is dissolved and removed and a negative-type resist composition for forming a negative-type pattern in which the unexposed area of the resist film is dissolved and removed, and the composition is preferably a negative-type resist composition. As the negative-type resist composition, for example, a resist composition including an acid generator and a base material component in which the solubility in a developing solution including an organic solvent by the action of an acid is decreased by the action of an acid, and the base material component includes a resin component having a constituent unit which is decomposed by the action of an acid to increase the polarity is preferable.

After the BCP composition is poured on the undercoat agent layer on which the guide pattern is formed, an annealing treatment is performed to cause phase separation. Therefore, as the resist composition for forming the guide pattern, it is preferable that the composition form a resist film excellent in solvent resistance and heat resistance.

EXAMPLES

Hereinafter, the present invention will be described in more detail with reference to Examples, but the present invention is not limited to these examples.

Synthesis of BCP Precursor

Synthesis of BCP Precursor (1)

All anionic polymerizations were carried out in an argon atmosphere. 30 mL of tetrahydrofuran (THF) and lithium chloride (LiCl) (21.2 mg, 0.500 mmol) were transferred into a 50 mL Schlenk tube and cooled to −78° C. in a Coolnics bath. Sec-butyllithium (Sec-BuLi) (1.05M hexane/cyclohexane solution) was added to the Schlenk tube until the color of the solution turned yellow. The Schlenk tube was removed from the Coolnics bath and warmed to room temperature until a colorless solution was obtained. The Schlenk tube was cooled again in a Coolnics bath to −78° C., and sec-BuLi (0.095 mL, 0.100 mmol) was added as an initiator. Styrene (1.03 mL, 9.04 mmol) was added and stirred for 30 minutes. As a result, a bright orange colored solution was obtained. 1,1-Diphenylethylene (DPE) (0.088 mL, 0.50 mmol) was added and the color of the solution turned deep red. After stirring for 30 minutes, a monomer mixture of methyl methacrylate (MMA) (0.80 mL, 7.50 mmol) and glycidyl methacrylate (GMA) (0.325 mL, 2.50 mmol) was added, and the mixture was stirred for 30 minutes. The solution turned from the red colored solution to a transparent solution. As a terminator, 3 mL of degassed methanol (MeOH) was added to the Schlenk tube to terminate the polymerizations. The Schlenk tube was pulled up from the Coolnics bath, and the solution was introduced into MeOH to perform reprecipitation. The solid of the precipitate was filtered and then dried under reduced pressure at 40° C. to obtain a white powder of the BCP precursor (1) (1.76 g, 88% yield). The Mn and dispersity (PDI=Mw/Mn) of the BCP precursor (1) measured by size-exclusion chromatography (SEC) were 18.7 mol$^{-1}$ and 1.24, respectively.

$^1$H NMR (400 MHz, CDCl$_3$, δ, ppm): 0.85 (s, α-CH$_3$, PMMA), 1.01 (s, α-CH$_3$, PGMA), 1.23 to 1.69 (br, backbone, —CH$_2$—CH—, PS), 1.74 to 2.02 (br, backbone, —CH$_2$—CH—, PS, br, backbone, —CH$_2$—C(CH$_3$)—, PGMA and PMMA), 2.63 (s, —CH$_2$—CH(CH$_2$)—O—, PGMA), 2.84 (s, —CH$_2$CH(CH$_2$)—O—, PGMA), 3.21 (s, —CH$_2$—CH(CH$_2$)—O—, PGMA), 3.59 (s, —OCH$_3$, PMMA), 3.79 (s, —(C=O)O—CH$_2$—, PGMA), 4.28 (d, —(C=O)O—CH$_2$—, PGMA), 6.39 to 6.85 (m, o-aromatic, PS), 6.91 to 7.42 (m,m-, p-aromatic, PS).

Synthesis of BCP Precursor (2)

The BCP precursor (2) was synthesized in the same manner as in the synthesis of the BCP precursor (1), except that the amount of MMA used was 0.693 mL (6.5 mmol) and the amount of GMA used was 0.455 mL (3.5 mmol). The Mn and dispersity (PDI=Mw/Mn) of the BCP precursor (2) measured by size-exclusion chromatography (SEC) were 20.2 gmol$^{-1}$ and 1.17, respectively.

Synthesis of BCP Precursor (3)

The BCP precursor (3) was synthesized in the same manner as in the synthesis of the BCP precursor (1), except that the amount of MMA used was 0.576 mL (5.4 mmol) and the amount of GMA used was 0.598 mL (4.6 mmol). The Mn and dispersity (PDI=Mw/Mn) of the BCP precursor (3) measured by size-exclusion chromatography (SEC) were 19.7 gmol$^{-1}$ and 1.17, respectively.

Synthesis of BCP Precursor (4)

The BCP precursor (4) was synthesized in the same manner as in the synthesis of the BCP precursor (1), except that the amount of MMA used was 0.693 mL (6.5 mmol) and the amount of GMA used was 0.455 mL (3.5 mmol). The Mn and dispersity (PDI=Mw/Mn) of the BCP precursor (4) measured by size-exclusion chromatography (SEC) were 9.8 gmol$^{-1}$ and 1.23, respectively.

Synthesis of BCP Precursor (5)

The BCP precursor (5) was synthesized in the same manner as in the synthesis of the BCP precursor (1), except that the amount of MMA used was 0.565 mL (5.3 mmol) and the amount of GMA used was 0.611 mL (4.7 mmol). The Mn and dispersity (PDI=Mw/Mn) of the BCP precursor (5) measured by size-exclusion chromatography (SEC) were 9.7 gmol$^{-1}$ and 1.18, respectively.

Synthesis of BCP Precursor (6)

The BCP precursor (6) was synthesized in the same manner as in the synthesis of the BCP precursor (1), except that the amount of MMA used was 0.363 mL (3.4 mmol) and the amount of GMA used was 0.858 mL (6.6 mmol). The Mn and dispersity (PDI=Mw/Mn) of the BCP precursor (6) measured by size-exclusion chromatography (SEC) were 6.9 gmol$^{-1}$ and 1.23, respectively.

Synthesis of BCP Precursor (7)

All polymerization operations were performed in an Ar atmosphere. 50 mL of THF and lithium chloride (LiCl) (28.7 mg, 0.678 mmol) were placed into a 100 mL Schlenk tube and immersed in a Coolnics bath set at −78° C. Sec-butyllithium (Sec-BuLi) (1.05M hexane/cyclohexane solution) was added until the solution turned from a transparent solution to a yellow colored solution. The Schlenk tube was removed from the Coolnics bath and left at room temperature until the solution returned to the transparent solution. The Schlenk tube was again immersed in the Coolnics bath set at −78° C., sec-BuLi (0.136 mmol) was added as an initiator, and the solution turned from the transparent solution to the yellow colored solution. Styrene (1.25g, 12.1 mmol) was added and stirred for 30 minutes. The color of the solution turned from yellow to orange. Subsequently, 1,1-diphenylethylene (0.237 mL, 1.26 mmol) was added, and the mixture was stirred for 30 minutes. The color of the solution turned red. Subsequently, MMA (1.03 g, 10.3 mmol) and allyl methacrylate (AMA) (0.684 g, 4.89 mmol) were added, and the mixture was stirred for 30 minutes. The solution turned from the red colored solution to the transparent solution. An excess amount of methanol (MeOH) (5 mL) subjected to Ar-bubbling was added as a terminator to terminate the polymerization. The Schlenk tube was pulled up from the Coolnics bath, and the solution was introduced into MeOH to perform reprecipitation. The solid of the precipitate was filtered and then dried under reduced pressure at 40° C. to obtain the BCP precursor (7) of a white solid (3.05 g, 89% yield). The Mn and dispersity (PDI=Mw/Mn) of the BCP precursor (7) measured by SEC were 19,200 gmol$^{-1}$ and 1.09, respectively.

$^1$H NMR (400 MHz, acetone-d$_6$, δ, ppm): 0.98 (s, α-CH$_3$, PMMA, PAllylMA), 1.14 (s, α-CH$_3$, PMMA, PAllylMA), 1.29 to 1.80 (br, backbone, —CH$_2$—CH—, PS), 1.84 to 2.30 (br, backbone, —CH$_2$—CH—, PS, br, backbone, —CH$_2$—C(CH$_3$)—, PMMA, PAllylMA), 4.88 (dd, —CH=CH$_2$, PAllylMA), 5.13 (dd, —CH=CH$_2$, PAllylMA), 5.82 (dd, —CH=CH$_2$, PAllylMA).

Synthesis of BCP Precursor (8)

The BCP precursor (8) was synthesized in the same manner as in the synthesis of the BCP precursor (1), except that the amount of MMA used was 0.576 mL (5.4 mmol) and the amount of GMA used was 0.598 mL (4.6 mmol). The Mn and dispersity (PDI=Mw/Mn) of the BCP precursor (8) measured by size-exclusion chromatography (SEC) were 11.5 gmol$^{-1}$ and 1.18, respectively.

Synthesis of BCP Precursor (9)

The BCP precursor (9) was synthesized in the same manner as in the synthesis of the BCP precursor (1), except that the amount of MMA used was 0.597 mL (5.6 mmol) and the amount of GMA used was 0.572 mL (4.4 mmol). The Mn and dispersity (PDI=Mw/Mn) of the BCP precursor (9) measured by size-exclusion chromatography (SEC) were 10.2 gmol$^{-1}$ and 1.17, respectively.

Synthesis of BCP Precursor (10)

The BCP precursor (10) was synthesized in the same manner as in the synthesis of the BCP precursor (1), except that the amount of MMA used was 0.789 mL (7.4 mmol) and the amount of GMA used was 0.338 mL (2.6 mmol). The Mn and dispersity (PDI=Mw/Mn) of the BCP precursor (10) measured by size-exclusion chromatography (SEC) were 11.3 gmol$^{-1}$ and 1.19, respectively.

Synthesis of BCP Precursor (11)

The BCP precursor (11) was synthesized in the same manner as in the synthesis of the BCP precursor (1), except that the amount of MMA used was 0.832 mL (7.8 mmol) and the amount of GMA used was 0.286 mL (2.2 mmol). The Mn and dispersity (PDI=Mw/Mn) of the BCP precursor (11) measured by size-exclusion chromatography (SEC) were 12.4 gmol$^{-1}$ and 1.18, respectively.

Synthesis of BCP Precursor (12)

The BCP precursor (12) was synthesized in the same manner as in the synthesis of the BCP precursor (1), except that the amount of MMA used was 0.8 mL (7.5 mmol) and the amount of GMA used was 0.325 mL (2.5 mmol). The Mn and dispersity (PDI=Mw/Mn) of the BCP precursor (12) measured by size-exclusion chromatography (SEC) were 12.0 gmol$^{-1}$ and 1.17, respectively.

Synthesis of Block Copolymer

Synthesis of BCP (1)

0.2 g of the BCP precursor (1) and THF (20 wt % solution) were placed into a 10 mL glass tube, and the mixture thereof was immersed in an ice water tank. A 1 wt % lithium hydroxide (LiOH) aqueous solution (LiOH 0.05 molar equivalent/GMA unit) and 2,2,2-trifluoroethanethiol (2 molar equivalent/GMA unit) were added to the glass tube. After stirring the mixture at room temperature for 20 minutes, a reactor was set to 40° C., and the mixture was stirred for 3 hours to synthesize BCP (1). Residual reagents were removed by precipitation being repeatedly performed with methanol or methanol/hexane several times, depending on the Mn and PHFMA fractions of the synthesized BCP (1). The product was dried under reduced pressure overnight at room temperature to obtain a white powder of the BCP (1). The Mn and dispersity (PDI=Mw/Mn) of the BCP precursor (1) measured by size-exclusion chromatography (SEC) were 20,700 gmol$^{-1}$ and 1.24, respectively.

$^1$H NMR (400 MHz, Acetone-d$_6$, δ, ppm): 0.84 (s, α-CH$_3$, PMMA), 0.87 (s, α-CH$_3$, PMMA), 1.00 (s, α-CH$_3$, PMMA), 1.03 (s, α-CH$_3$, PGMA), 1.23 to 1.73 (br, backbone, —CH$_2$—CH—, PS), 1.75 to 2.23 (br, backbone, —CH$_2$—CH—, PS, br, backbone, —CH$_2$—C(CH$_3$)—, PGMA and PMMA), 2.78 to 3.00 (d, CH(OH)—CH$_2$—S—, PHFMA), 3.40 to 3.77 (s, —S—CH$_2$—CF$_3$, PHFMA), 3.54 to 3.75 (s, —OCH$_3$, PMMA), 3.92 to 4.07 (d, —(C=O)O—CH$_2$—, PHFMA), 4.07 to 4.18 (m, —CH(OH)—, PHFMA), 4.50 to 4.72 (br, —CH(OH)—, PHFMA), 6.36 to 6.84 (m, o-aromatic, PS), 6.85 to 7.35 (m, m-, p-aromatic, PS).

Synthesis of BCP (2) to (6)

Each of BCP (2) to (6) was synthesized in the same manner as in the synthesis of the BCP (1), except that each of the BCP precursors (2) to (6) was used instead of the BCP precursor (1).

The Mn and dispersity (PDI=Mw/Mn) of the BCP (2) measured by size-exclusion chromatography (SEC) were 25,200 gmol$^{-1}$ and 1.15, respectively. The Mn and dispersity (PDI=Mw/Mn) of the BCP (3) measured by size-exclusion chromatography (SEC) were 25,000 gmol$^{-1}$ and 1.16, respectively. The Mn and dispersity (PDI=Mw/Mn) of the BCP (4) measured by size-exclusion chromatography (SEC) were 10,600 gmol$^{-1}$ and 1.19, respectively. The Mn and dispersity (PDI=Mw/Mn) of the BCP (5) measured by size-exclusion chromatography (SEC) were 11,600 gmol$^{-1}$ and 1.21, respectively. The Mn and dispersity (PDI=Mw/Mn) of the BCP (6) measured by size-exclusion chromatography (SEC) were 8,500 gmol$^{-1}$ and 1.19, respectively.

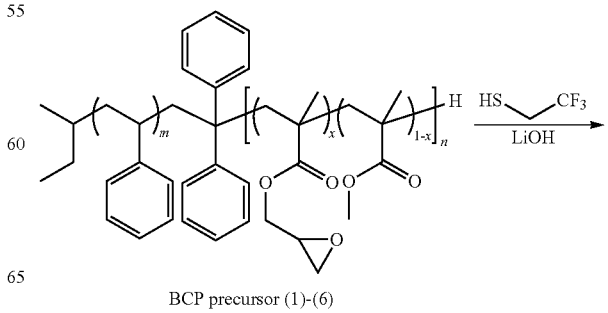

BCP precursor (1)-(6)

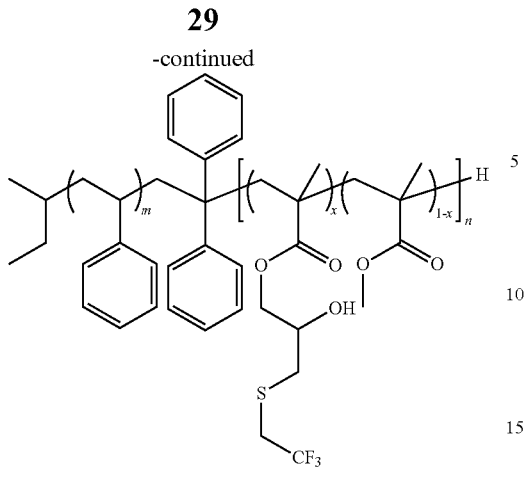

BCP (1)-(6)

(1) x = 0.25
(2) x = 0.35
(3) x = 0.46
(4) x = 0.35
(5) x = 0.47
(6) x = 0.66

Synthesis of BCP (7)

The BCP precursor (7) (1.0 g) and THF (3 mL) were added to a 10 mL round-bottom flask and stirred. After the BCP precursor (7) was dissolved in THF, 2,2,2-trifluoroethanethiol (1.14 g, 9.82 mmol) and 2,2'-azobis(isobutyronitrile) (AIBN) (95.2 mg, 0.58 mmol) were added. The inside of a reaction system was replaced with argon, the mixture was stirred in an oil bath set at 65° C. for 2 hours, and then a reaction solution was introduced into a mixed solvent of MeOH and water to perform reprecipitation. After filtration, dissolution in THF, reprecipitation of MeOH and water in the mixed solvent, and filtration were repeated 3 times, and then drying was performed under reduced pressure at room temperature to obtain a white solid of BCP (7). The Mn and dispersity (PDI=Mw/Mn) of the BCP (7) measured by size-exclusion chromatography (SEC) were 21,300 gmol$^{-1}$ and 1.14, respectively.

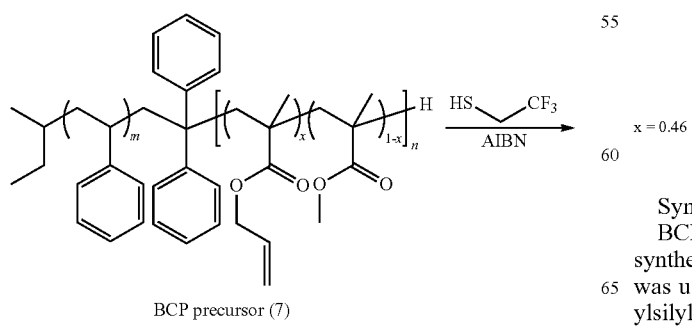

BCP precursor (7)

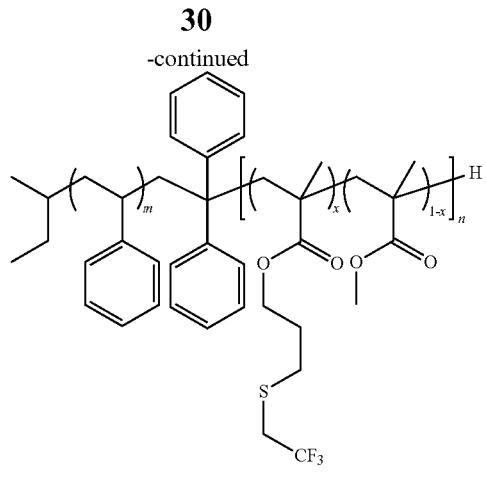

BCP (7)

x = 0.42

Synthesis of BCP (8)

BCP (8) was synthesized in the same manner as in the synthesis of the BCP (1), except that the BCP precursor (8) was used instead of the BCP precursor (1), and ethanethiol was used instead of 2,2,2-trifluoroethanethiol. The Mn and dispersity (PDI=Mw/Mn) of the BCP (8) measured by size-exclusion chromatography (SEC) were 14,500 gmol$^{-1}$ and 1.15, respectively.

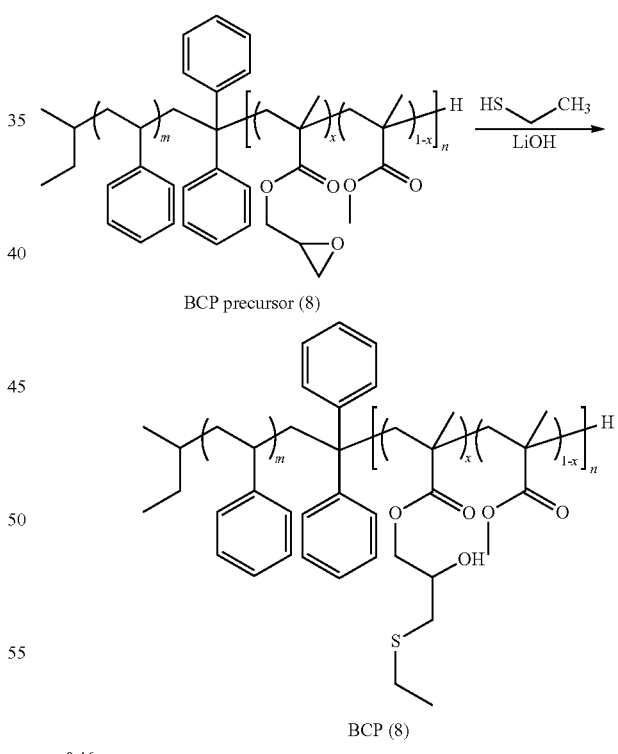

BCP precursor (8)

BCP (8)

x = 0.46

Synthesis of BCP (9)

BCP (9) was synthesized in the same manner as in the synthesis of the BCP (1), except that the BCP precursor (9) was used instead of the BCP precursor (1), and 2-(trimethylsilyl)ethanethiol was used instead of 2,2,2-trifluoroethanethiol. The Mn and dispersity (PDI=Mw/Mn) of the BCP (9) measured by size-exclusion chromatography (SEC) were 13,000 gmol$^{-1}$ and 1.16, respectively.

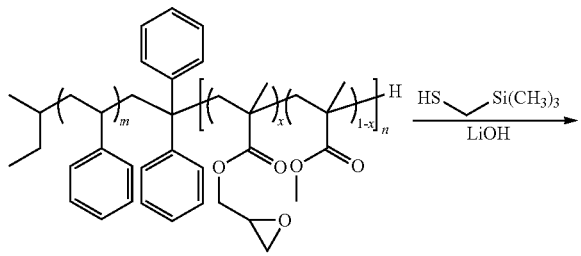

BCP precursor (9)

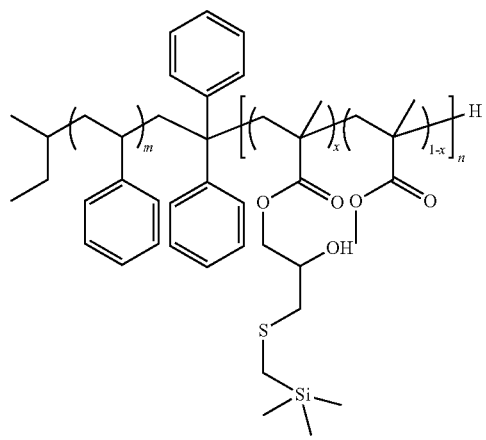

BCP (9)

x = 0.44

Synthesis of BCP (10)

BCP (10) was synthesized in the same manner as in the synthesis of the BCP (1), except that the BCP precursor (10) was used instead of the BCP precursor (1), and 2-aminoethanethiol was used instead of 2,2,2-trifluoroethanethiol. The Mn and dispersity (PDI=Mw/Mn) of the BCP (10) measured by size-exclusion chromatography (SEC) were 12,500 gmol$^{-1}$ and 1.16, respectively.

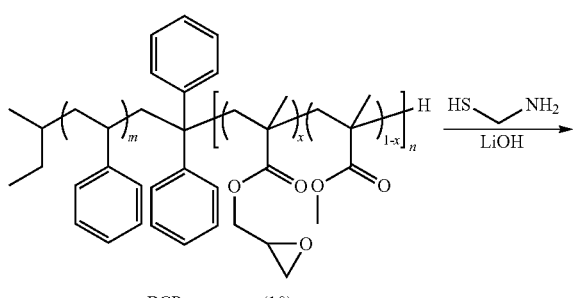

BCP precursor (10)

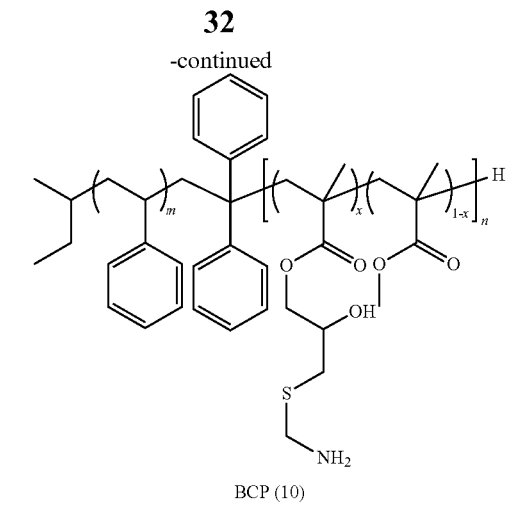

BCP (10)

x = 0.26

Synthesis of BCP (11)

BCP (11) was synthesized in the same manner as in the synthesis of the BCP (1), except that the BCP precursor (11) was used instead of the BCP precursor (1), and 2-hydroxyethanethiol was used instead of 2,2,2-trifluoroethanethiol. The Mn and dispersity (PDI=Mw/Mn) of the BCP (11) measured by size-exclusion chromatography (SEC) were 13,700 gmol$^{-1}$ and 1.14, respectively.

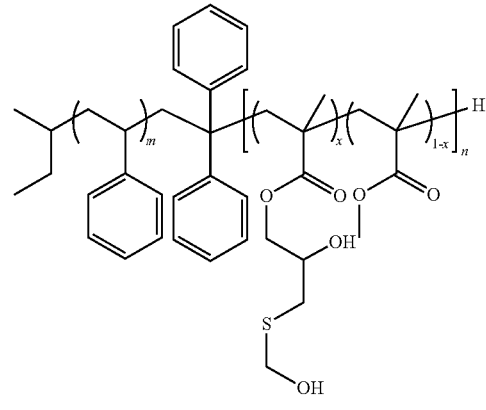

BCP precursor (11)

BCP (11)

x = 0.22

Synthesis of BCP (12)

BCP (12) was synthesized in the same manner as in the synthesis of the BCP (1), except that the BCP precursor (12) was used instead of the BCP precursor (1), and 5-carboxy-1-pentanethiol was used instead of 2,2,2-trifluoroethanethiol. The Mn and dispersity (PDI=Mw/Mn) of the BCP

(12) measured by size-exclusion chromatography (SEC) were 13,300 gmol$^{-1}$ and 1.16, respectively.

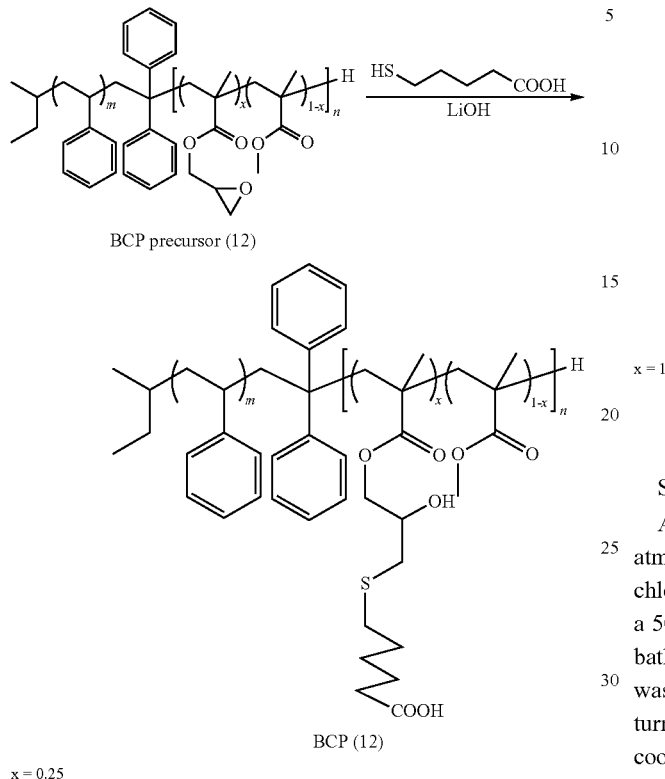

BCP precursor (12)

BCP (12)

x = 0.25

Synthesis of BCP (13)

A proton-terminated PS-b-PGMA having a block of polystyrene (PS) and a block of polyglycidyl methacrylate (PGMA) was synthesized in the same manner as in the synthesis of the BCP precursor (1), except that MMA was used instead of the monomer mixture of MMA and GMA.

BCP (13) was synthesized in the same manner as in the synthesis of the BCP (1), except that synthesized PS-b-PGMA was used instead of the BCP precursor (1). The Mn and dispersity (PDI=Mw/Mn) of the BCP (13) measured by size-exclusion chromatography (SEC) were 12,900 gmol$^{-1}$ and 1.10, respectively.

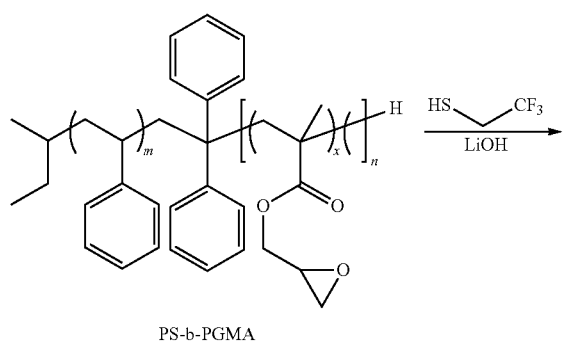

PS-b-PGMA

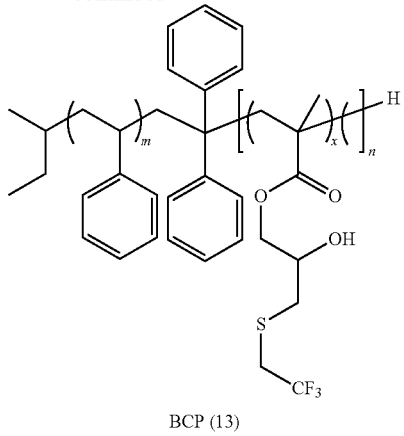

BCP (13)

x = 1

Synthesis of BCP (14)

All anionic polymerizations were carried out in an argon atmosphere. 40 mL of tetrahydrofuran (THF) and lithium chloride (LiCl) (34.7 mg, 0.819 mmol) were transferred into a 50 mL Schlenk tube and cooled to −78° C. in a Coolnics bath. Sec-butyllithium (Sec-BuLi) (1.5M hexane solution) was added to the Schlenk tube until the color of the solution turned yellow. The Schlenk tube was removed from the cooling bath and warmed to room temperature until a colorless solution was obtained. The Schlenk tube was cooled again in a Coolnics bath to −78° C., and sec-BuLi (0.095 mL, 0.100 mmol) was added as an initiator. Styrene (1.4 mL, 12.2 mmol) was added and stirred for 30 minutes. As a result, a bright orange colored solution was obtained. 1,1-Diphenylethylene (DPE) (0.088 mL, 0.50 mmol) was added and the color of the solution turned deep red. After stirring for 30 minutes, GMA (0.150 mL, 1.13 mmol) was added to discolor the solution, and the mixture was further stirred for 30 minutes. Next, MMA (1.60 mL, 15.0 mmol) was added and stirred for 30 minutes. As a terminator, 3 mL of degassed methanol (MeOH) was added to the Schlenk tube to terminate the polymerizations. The Schlenk tube was pulled up from the Coolnics bath, and the solution was introduced into MeOH to perform reprecipitation. After filtering the solid of the precipitate, drying was performed under reduced pressure at 40° C., and a white powder of the block copolymer (PS-b-PGMA-b-PMMA) having the block of polystyrene (PS), the block of polyglycidyl methacrylate (PGMA), and the block of polymethyl methacrylate (PMMA) was obtained (2.52 g, 85% yield).

BCP (14) was synthesized in the same manner as in the synthesis of BCP (1), except that the synthesized PS-b-PGMA-b-PMMA was used instead of the BCP precursor (1). The Mn and dispersity (PDI=Mw/Mn) of the BCP (14) measured by size-exclusion chromatography (SEC) were 14,700 gmol$^{-1}$ and 1.18, respectively.

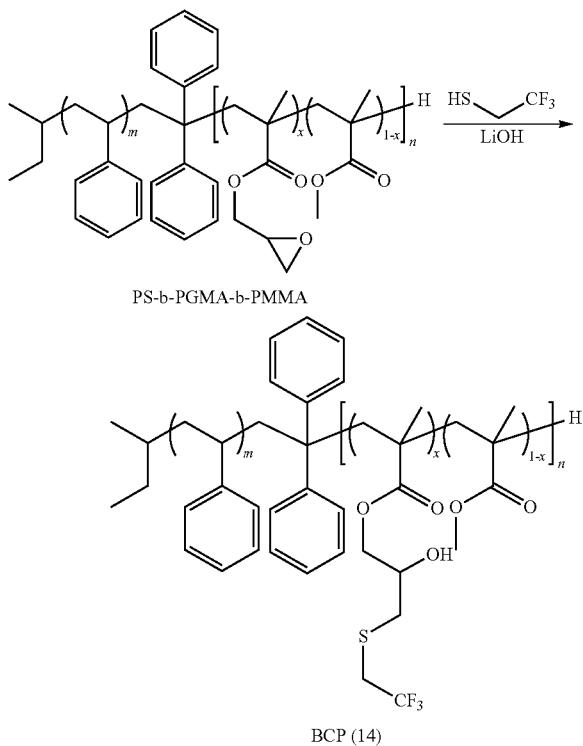

PS-b-PGMA-b-PMMA

BCP (14)

x = 0.20

Measurement of Volume of Each Block

The % by mol of each block in the block copolymer was calculated from the result of $^1$H NMR analysis, and the % by mass of each block was further calculated. Next, the % by mass of each block was divided by a density of each block to calculate a ratio of a volume of each block. From the ratio of the volume, a ratio of a volume of the polystyrene block to the total volume of the block copolymer was calculated. The density of each block was estimated by the atomic group contribution method (Fedors, R. F. Polym. Eng. Sci. 1974, 14, 147-154.). A density of 1.05 gm$^{-3}$ of the polystyrene block was used. 1.18 gcm$^{-3}$ can be used as a density of the structure that is constituted of the constituent unit induced from methyl methacrylate. 1.43 gcm$^{-3}$ can be used as a density of the structure that is constituted of the constituent unit induced from 2-hydroxy-3-(2,2,2-trifluoroethylsulfanyl)propyl methacrylate (BCP (1) to BCP (6), BCP (13), and BCP (14)). In the BCP (7) to BCP (12), as the density of the structure constituted of the constituent unit corresponding to the constituent unit (b2g), BCP (7): 1.34 gcm$^{-3}$; BCP (8): 1.17 gcm$^{-3}$; BCP (9): 1.06 gcm$^{-3}$; BCP (10): 1.25 gcm$^{-3}$; BCP (11): 1.28 gcm$^{-3}$; BCP (12): 1.20 gcm$^{-3}$ were used.

The number-average molecular weight (Mn) of each of the synthesized block copolymers, the ratio of the volume of the block of polystyrene (PS) to the total volume of the block copolymer (% by volume), and the value of x in the reaction formulae are summarized in Table 1.

TABLE 1

|  | Mn | % by volume of PS | x |
|---|---|---|---|
| BCP (1) | 20.7 | 47 | 0.25 |
| BCP (2) | 25.2 | 45 | 0.35 |

TABLE 1-continued

|  | Mn | % by volume of PS | x |
|---|---|---|---|
| BCP (3) | 25.0 | 41 | 0.46 |
| BCP (4) | 10.6 | 60 | 0.35 |
| BCP (5) | 11.6 | 41 | 0.47 |
| BCP (6) | 8.5 | 39 | 0.66 |
| BCP (7) | 21.3 | 44 | 0.42 |
| BCP (8) | 14.5 | 47 | 0.46 |
| BCP (9) | 13.0 | 39 | 0.44 |
| BCP (10) | 12.5 | 45 | 0.26 |
| BCP (11) | 13.7 | 48 | 0.22 |
| BCP (12) | 13.3 | 43 | 0.25 |
| BCP (13) | 12.9 | 57 | 1.00 |
| BCP (14) | 14.7 | 46 | 0.20 |

Preparation of Resin Composition for Forming Phase-Separated Structure

Each component indicated in Table 2 was mixed and dissolved to prepare a resin composition for forming a phase-separated structure (solid content concentration of 0.8% by mass) in each example.

TABLE 2

|  | Block copolymer | Organic solvent component |
|---|---|---|
| Example 1 | BCP-1 [100] | (S)-1 [12400] |
| Example 2 | BCP-2 [100] | (S)-1 [12400] |
| Example 3 | BCP-3 [100] | (S)-1 [12400] |
| Example 4 | BCP-4 [100] | (S)-1 [12400] |
| Example 5 | BCP-5 [100] | (S)-1 [12400] |
| Example 6 | BCP-6 [100] | (S)-1 [12400] |
| Example 7 | BCP-7 [100] | (S)-1 [12400] |
| Example 8 | BCP-8 [100] | (S)-1 [12400] |
| Example 9 | BCP-9 [100] | (S)-1 [12400] |
| Example 10 | BCP-10 [100] | (S)-1 [12400] |
| Example 11 | BCP-11 [100] | (S)-1 [12400] |
| Example 12 | BCP-12 [100] | (S)-1 [12400] |
| Comparative Example 1 | BCP-13 [100] | (S)-1 [12400] |
| Comparative Example 2 | BCP-14 [1001] | (S)-1 [12400] |

Each of the abbreviations in Table 1 has the following meanings. The numerical values in the brackets were the blending amount (parts by mass).

BCP-1: The BCP (1).
BCP-2: The BCP (2).
BCP-3: The BCP (3).
BCP-4: The BCP (4).
BCP-5: The BCP (5).
BCP-6: The BCP (6).
BCP-7: The BCP (7).
BCP-8: The BCP (8).
BCP-9: The BCP (9).
BCP-10: The BCP (10).
BCP-11: The BCP (11).
BCP-12: The BCP (12).
BCP-13: The BCP (13).
BCP-14: The BCP (14).

(S)-1: Propylene glycol monomethyl ether acetate.

Production of Structure Including Phase-Separated Structure

After a guide pattern was formed with the resist composition, a structure containing a phase-separated structure was obtained by a production method including the following steps (i) and (ii) using the resin composition for forming a phase-separated structure in each example described above.

Formation of Guide Pattern:

An organic anti-reflective film composition "ARC-29A" (trade name, manufactured by Brewer Science, Inc.) was applied to a 12-inch silicon wafer using a spinner, and the composition was then baked and dried on a hotplate at 205° C. for 60 seconds, thereby forming an organic anti-reflective film with a film thickness of 89 nm. A crosslinked neutral film composition solution was spin-coated on the organic anti-reflective film, and then heated at 250° C. for 600 seconds. As a result, a thin film with a film thickness of 10 nm made of the crosslinked neutral film composition was formed on the surface of the substrate. A resist film for forming a guide pattern was applied onto the film using a spinner, prebaked (PAB) on a hotplate, and dried to form a resist film for forming a guide pattern with a film thickness of 90 nm. Selective ArF excimer laser irradiation (193 nm) was performed through a mask pattern using the ArF exposure apparatus XT-1900Gi (manufactured by ASML). Then, the resist film was subjected to post-exposure bake (PEB) treatment, further developed with butyl acetate, and shaken off to dry. Next, post-bake treatment was performed under conditions of 100° C. for 1 minute and then 200° C. for 5 minutes to form a guide pattern matching the space dimension four times a d value of the used block copolymer.

Step (i):

On the substrate on which the guide pattern was formed, the resin composition of each example was spin-coated so as to have a film thickness of 24 nm, thereby forming a resin composition layer (layer including a block copolymer).

Step (ii):

The resin composition layer formed on the substrate was prebaked at 90° C. for 60 seconds under a nitrogen atmosphere, and then annealed at 200° C. for 30 minutes under a nitrogen atmosphere to form a phase-separated structure.

Step (iii):

Oxygen plasma treatment (200 mL/min, 40 Pa, 40° C., 200 W, 20 seconds) was performed on the substrate on which the phase-separated structure was formed by using TCA-3822 (manufactured by TOKYO OHKA KOGYO CO., LTD.) and thus a PMMA phase was selectively removed.

Measurement of Period of Structure

The measurement was performed by the small-angle X-ray scattering (SAXS) method, and the period (nm) of the structure was determined at the first scattering peak of the SAXS pattern curve. The results are shown in Table 3 as "Period".

Observation of Morphology

The surface (in the phase-separated state) of the obtained substrate was observed with a length-measuring SEM (scanning electron microscope, trade name: CG6300, manufactured by Hitachi High-Tech Corporation) to confirm the morphology of the phase-separated structure. The results are shown in Table 3 as "Morphology".

Evaluation of Vertical Orientation

The surface (in the phase-separated state) of the obtained substrate was observed with a length-measuring SEM (scanning electron microscope, trade name: CG6300, manufactured by Hitachi High-Tech Corporation).

As a result of such observation, the phase separation performance was evaluated based on the following evaluation criteria. The results are shown in Table 3 as "Vertical orientation".

A: Vertical orientation was observed
B: No vertical orientation was observed

Evaluation of Pattern Defect

The pattern after step (ii) in "Production of Structure Including Phase-separated Structure" was observed from the 10 sheets above at a magnification of 100,000 times by a length-measuring SEM (scanning electron microscope, trade name: CG6300, manufactured by Hitachi High-Technologies Corporation), and the number of defects was counted.

As a result of such observation, the pattern defects were evaluated based on the following evaluation criteria. The results are shown in Table 3 as "Defect".

Evaluation Criteria
A: Total number of defects is less than 100.
B: Total number of defects is 100 or greater.

TABLE 3

| | Period (nm) | Morphology | Vertical orientation | Defect |
| --- | --- | --- | --- | --- |
| Example 1 | 22.9 | Lamella | A | A |
| Example 2 | 22.8 | Lamella | A | A |
| Example 3 | 23.8 | Lamella | A | A |
| Example 4 | 14.3 | Lamella | A | A |
| Example 5 | 15.3 | Lamella | A | A |
| Example 6 | 14.4 | Cylinder | A | A |
| Example 7 | 21.0 | Lamella | A | A |
| Example 8 | 15.2 | Lamella | A | A |
| Example 9 | 15.6 | Lamella | A | A |
| Example 10 | 16.0 | Lamella | A | A |
| Example 11 | 16.2 | Lamella | A | A |
| Example 12 | 16.1 | Lamella | A | A |
| Comparative Example 1 | 16.1 | Lamella | B | B |
| Comparative Example 2 | 15.2 | Cylinder | A | B |

From the results shown in Table 3, it was confirmed that in Examples 1 to 12, phase-separated structures were formed in which both excellent vertical orientation and reduced pattern defects were achieved. On the other hand, in Comparative Example 1, a vertically oriented phase-separated structure could not be formed, and the number of defects was large. Furthermore, in Comparative Example 2, a vertically oriented phase-separated structure could not be formed, and the number of defects was large.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1 . . . Support
2 . . . Undercoat agent layer
3 . . . BCP layer
3' . . . Structure

What is claimed is:

1. A resin composition for forming a phase-separated structure, comprising:
   a block copolymer having a first block and a second block,
   wherein the first block includes a polymer having a repeating structure of a constituent unit represented by General Formula (b1),
   the second block includes a random copolymer having a structure in which a constituent unit represented by General Formula (b2m) and a constituent unit represented by General Formula (b2g) are arranged in a disorderly manner, and
   a ratio of a volume of the first block to a total volume of the first block and the second block is 20% to 80% by volume,

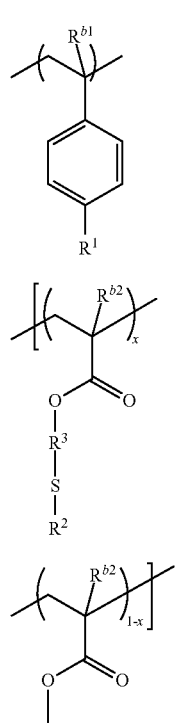

wherein, in Formula (b1), $R^1$ is a hydrogen atom or an alkyl group, and $R^{b1}$ is a hydrogen atom or a methyl group,
in Formula (b2g), $R^2$ is an alkyl group which may have a silicon atom, a fluorine atom, a carboxy group, an amino group, a hydroxy group, or a phosphoric acid group, and
$R^3$ is a linear or branched alkylene group having 1 to 10 carbon atoms, which may have a hydroxy group, and
in Formula (b2g) and Formula (b2m), $R^{b2}$ is a hydrogen atom, an alkyl group having 1 to 5 carbon atoms, or a halogenated alkyl group having 1 to 5 carbon atoms, a plurality of $R^{b2}$s may be the same or different from each other, and
x and 1-x represent a molar ratio, and x is 0.1 or more and 0.9 or less.

2. The resin composition for forming a phase-separated structure according to claim 1, wherein in Formula (b2g) and Formula (b2m), x is more than 0.20 and 0.70 or less.

3. A method for producing a structure including a phase-separated structure, the method comprising:
   applying the resin composition for forming a phase-separated structure according to claim 1 on a support to form a layer including a block copolymer; and
   phase-separating the layer including the block copolymer.

4. A block copolymer, comprising:
   a first block; and
   a second block,
   wherein the first block includes a polymer having a repeating structure of a constituent unit represented by General Formula (b1),
   the second block includes a random copolymer having a structure in which a constituent unit represented by General Formula (b2m) and a constituent unit represented by General Formula (b2g) are arranged in a disorderly manner, and
   a ratio of a volume of the first block to a total volume of the first block and the second block is 20% to 80% by volume,

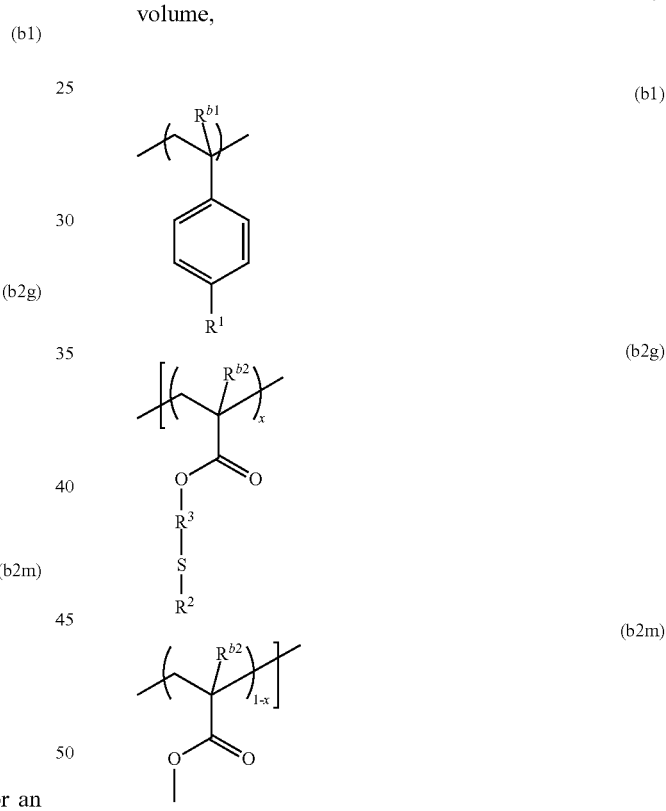

wherein, in Formula (b1), $R^1$ is a hydrogen atom or an alkyl group, and $R^{b1}$ is a hydrogen atom or a methyl group,
in Formula (b2g), $R^2$ is an alkyl group which may have a silicon atom, a fluorine atom, a carboxy group, an amino group, a hydroxy group, or a phosphoric acid group, and
$R^3$ is a linear or branched alkylene group having 1 to 10 carbon atoms, which may have a hydroxy group, and
in Formula (b2g) and Formula (b2m), $R^{b2}$ is a hydrogen atom, an alkyl group having 1 to 5 carbon atoms, or a halogenated alkyl group having 1 to 5 carbon atoms, a plurality of $R^{b2}$s may be the same or different from each other, and x and 1-x represent a molar ratio, and x is 0.1 or more and 0.9 or less.

5. The block copolymer according to claim 4, wherein in Formula (b2g) and Formula (b2m), x is more than 0.20 and 0.70 or less.

\* \* \* \* \*